(12) United States Patent
Fan et al.

(10) Patent No.: US 8,274,339 B2
(45) Date of Patent: Sep. 25, 2012

(54) AUTOMATIC FREQUENCY CONTROL ARCHITECTURE WITH DIGITAL TEMPERATURE COMPENSATION

(75) Inventors: Yongping Fan, Portland, OR (US); Jing Li, Folsom, CA (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 18 days.

(21) Appl. No.: 12/770,230

(22) Filed: Apr. 29, 2010

(65) Prior Publication Data

US 2011/0267150 A1 Nov. 3, 2011

(51) Int. Cl.
*H03L 1/02* (2006.01)
*H03L 7/085* (2006.01)

(52) U.S. Cl. ........... 331/176; 331/16; 331/17; 331/36 C; 331/117 FE; 327/156; 375/376

(58) Field of Classification Search .................... 331/16, 331/17, 34, 36 R, 117 FE, 117 R, 167, 176, 331/36 C; 327/147, 156; 375/373–376
See application file for complete search history.

(56) References Cited

U.S. PATENT DOCUMENTS

| | | | |
|---|---|---|---|
| 6,137,372 A * | 10/2000 | Welland | 331/117 R |
| 7,221,234 B2 | 5/2007 | Chien | |
| 7,221,921 B2 * | 5/2007 | Maligeorgos et al. | 455/260 |
| 7,269,402 B2 * | 9/2007 | Uozumi et al. | 455/255 |
| 7,583,151 B2 | 9/2009 | Fan et al. | |
| 7,656,245 B2 * | 2/2010 | McCorquodale et al. | 331/179 |
| 7,764,127 B2 * | 7/2010 | Sun et al. | 331/36 C |
| 7,965,144 B2 * | 6/2011 | Miura et al. | 331/44 |
| 7,978,017 B2 * | 7/2011 | Pernia et al. | 331/167 |
| 8,013,682 B2 * | 9/2011 | Hu et al. | 331/16 |
| 2008/0180185 A1 * | 7/2008 | Fan et al. | 331/117 R |

OTHER PUBLICATIONS

Optimizing VCO/PLL Evaluations & PLL Synthesizer Designs, Mini-Circuits, Yoni The Design Engineers Search Engine, date unknown, 6 pages.

* cited by examiner

*Primary Examiner* — Levi Gannon
(74) *Attorney, Agent, or Firm* — Finch & Maloney PLLC

(57) ABSTRACT

A mixed signal circuit architecture is disclosed for automatic frequency control and digital temperature compensation in an LC-PLL system. Some embodiments allow for high-volume manufacturing of products such as microprocessors and chipsets, and other circuits that employ LC-PLL technology. In some embodiments, various capacitor loadings can be selected to compensate for variation associated with process, voltage, temperature, and reference frequency. In addition, a multi-leg capacitor bank can be selectively used to further compensate for temperature variation post-lock, in accordance with some embodiments. A programmable timer can be used in some embodiments to allow for loop settling prior to assessing parameters of interest.

26 Claims, 10 Drawing Sheets

AUTOMATIC FREQUENCY CONTROL ARCHITECTURE WITH DIGITAL TEMPERATURE COMPENSATION

BACKGROUND

As industry is moving toward high-speed input/output (I/O) of 5 gigatransfers per second (GT/s) and higher, low jitter clocking architectures have become a more popular building block in phase locked loop (PLL) design. Compared with a self-biased differential ring oscillator based voltage-controlled oscillator (VCO), an inductor-capacitor VCO (designated as LC-VCO) may have a number of advantages. For instance, an LC-VCO may have lower random jitter at lower power consumption, as compared to ring oscillator based VCO designs. In addition, full-loop simulation also shows that a PLL implemented with an LC-VCO (designated as LC-PLL) may have better power supply rejection ratio (PSRR) than PLLs implemented with ring oscillator based VCO designs. There remain, however, a number of non-trivial issues associated with LC-PLL to be resolved.

DETAILED DESCRIPTION

Figure 1:
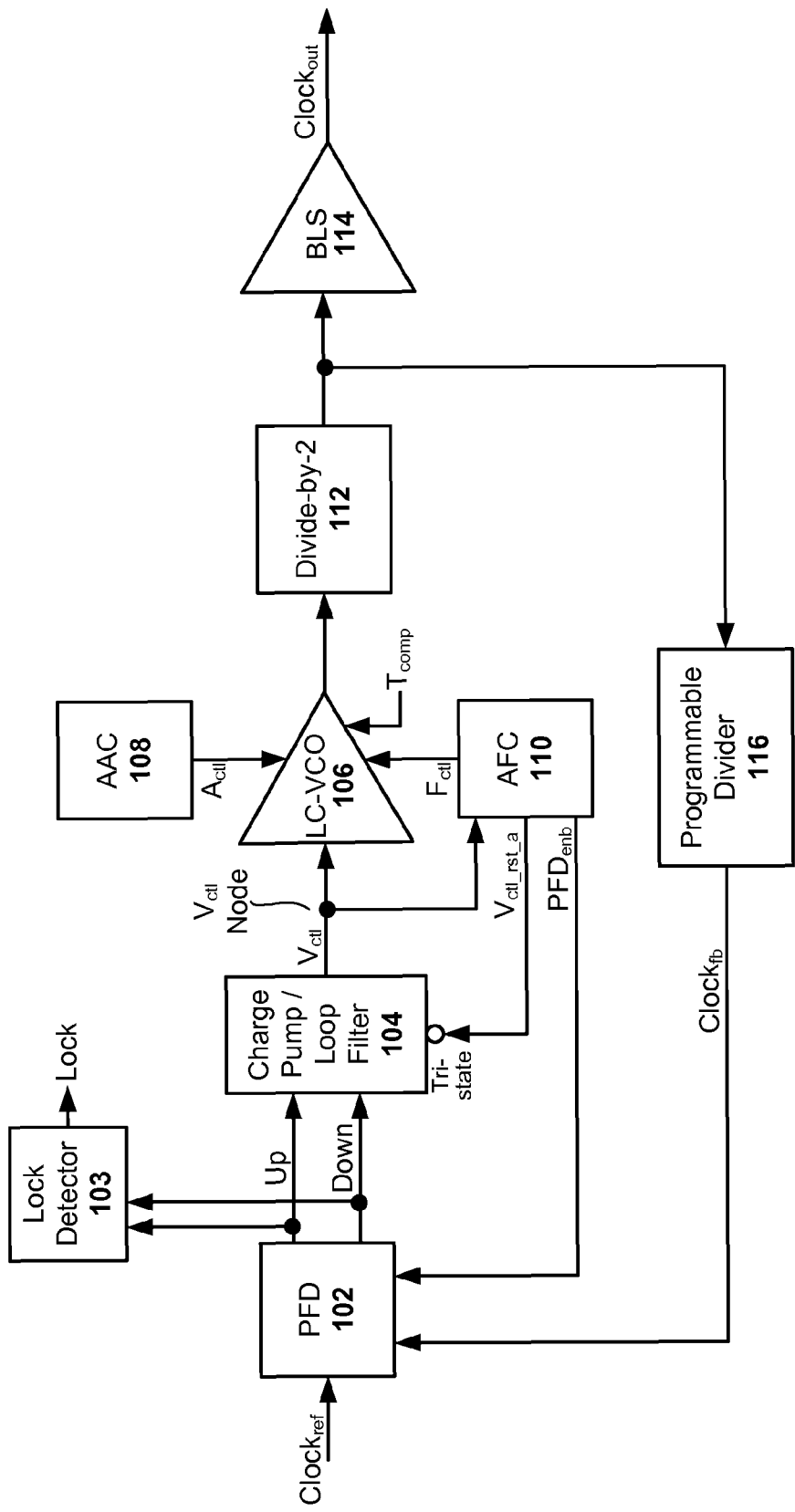
FIG. 1 is a block diagram an LC-PLL system configured in accordance with an embodiment of the present invention.

A mixed signal circuit architecture is disclosed for automatic frequency control (AFC) and digital temperature compensation in an LC-PLL system. The disclosed techniques, and in accordance with some embodiments of the present invention, allow for high-volume manufacturing of products such as microprocessors and chipsets, and other circuits that employ LC-PLL technology. In some embodiments, various capacitor loadings can be selected to compensate for variation associated with process, voltage, temperature, and reference frequency. In addition, a multi-leg capacitor bank can be selectively used to further compensate for temperature variation post-lock, in accordance with some embodiments. A programmable timer can be used in some embodiments to allow for loop settling prior to assessing parameters of interest. During lock, the VCO control voltage can be limited to the linear region of the frequency vs. control voltage curve, in accordance with some embodiments. In some such embodiments, if temperature increases after lock, the control voltage will increase to remain locked at target frequency, and the multi-leg capacitor bank compensates for the temperature drift.

General Overview

Ring oscillator type VCOs have been used in PLL systems for high-speed clock generation. An advantage of ring oscillator type VCOs, and the corresponding PLLs such as the self-biased PLL, is that they can be integrated in standard complementary metal oxide semiconductor (CMOS) technology without introducing additional process and modeling complexity. On the other hand, disadvantages of ring oscillator type VCOs include jitter due to higher thermal noise and power supply noise. Also, as CMOS process technology continues to scale down (e.g., below the 100 nm range), circuit complexity and operating speed tend to increase rapidly. For instance, a large number of I/Os may be desired on microprocessors and chipsets to communicate between chips. Low power, low jitter, and small area PLLs are helpful to generate high-speed clocks for these I/Os.

Given a desire for high-speed I/O data rate (e.g., 5 GT/s and higher), and stringent requirements on jitter performance of the oscillator in a PLL system, integrated LC-VCOs can be used to facilitate high-speed serial I/O links in circuits such as microprocessors and chipsets. As previously explained, however, there are a number of non-trivial issues associated with LC-PLL to be resolved, such as in cases where the LC-PLL is to be used in high-volume products like microprocessors and chipsets. For example, one such issue is the narrow frequency range of LC-VCOs. For instance, a typical LC-PLL frequency range may not be able to cover the frequency target in high-volume production applications due to process, voltage, and/or temperature variations.

To solve this narrow frequency range problem, and in accordance with an embodiment of the present invention, an automatic frequency control (AFC) architecture is configured to allow the frequency range of the LC-VCO to be expanded by compensating for or otherwise mitigating the effects of post-lock temperature variation. The AFC architecture can be further configured to compensate for process, voltage, temperature, and reference frequency variations, when acquiring lock. During post-lock operation, and in accordance with some embodiments, the control voltage $V_{ctl}$ of the LC-VCO can be limited to the linear range and the high gain region of frequency vs. control voltage (F-V) curves, even under temperature variation.

In one such example embodiment, and during the locking process, the AFC architecture is configured to automatically select one of the N capacitor loadings (e.g., N=16) based on, for example, process corners, voltage, temperature, and input reference frequency. The AFC architecture may further include a programmable timer for providing a waiting time for the loop to settle down before the next counter moves, and can use a state machine or other suitable mechanism to automatically select the appropriate capacitor loading. These capacitive loadings effectively allow for coarse tuning when acquiring lock. A capacitive varactor responsive to the control voltage can be used for fine tuning during the locking process. In one specific example embodiment, the control voltage $V_{ctl}$ of the LC-PLL can be limited to the linear range and the high gain region of F-V curves by adjusting two reference voltages, $V_{refhi}$ and $V_{reflow}$.

In one example case, after LC-PLL is locked to the target frequency, the counter is frozen and control voltage $V_{ctl}$ moves along a fixed F-V curve. If temperature increases after lock, the control voltage $V_{ctl}$ will go up in order to remain locked at target frequency. As the temperature increases, a conventional LC-VCO would be forced to work in flat non-linear region of the F-V curve where Kvco is low and loop bandwidth is susceptible to going out of spec, and the I/O link may fail. In accordance with an embodiment of the present invention, a capacitor bank configured with thermometer coded capacitor legs is provided to compensate the temperature drift.

In operation, and in accordance with one example embodiment, after the system is up running and the LC-PLL is locked to the target frequency, the LC-VCO is frozen to only one capacitor bank value. If the temperature increases after the initial condition, the control voltage $V_{ctl}$ in LC-VCO will increase. In this example embodiment, after the control voltage $V_{ctl}$ reaches the upper edge of the F-V linear region, the capacitor bank can be controlled so the capacitor legs are sequentially turned-off, thereby stopping the further increase of control voltage $V_{ctl}$ and maintaining the operating point inside the linear region. In a similar fashion, if the temperature decreases after the initial condition, the control voltage $V_{ctl}$ in LC-VCO will decreases. After the control voltage $V_{ctl}$ reaches the lower edge of the F-V linear region, the capacitor bank can be controlled so the capacitor legs are sequentially turned-on, thereby stopping the further decrease of control voltage $V_{ctl}$ and maintaining the operating point inside the linear region.

System Architecture

FIG. 1 is a block diagram a LC-PLL system configured in accordance with an embodiment of the present invention. As is known, a PLL system is a control system that uses negative feedback to generate a signal (in this case, $Clock_{out}$) that has a fixed relation to the phase of a reference signal (in this case, $Clock_{ref}$). The PLL responds to both frequency and phase of $Clock_{ref}$, and automatically adjusts the frequency of a controlled oscillator until it is matched to $Clock_{ref}$ in both frequency and phase. The LC-PLL system of this example embodiment is further configured to provide a wide frequency range, by compensating for parameter variations, including post-lock temperature shifts.

As can be seen in this example, the system includes a phase-frequency detector (PFD) 102, a lock detector 103, a charge pump/loop filter (CP/LF) 104, an LC-type VCO 106, an automatic amplitude control (AAC) circuit 108, an automatic frequency control (AFC) circuit 110, a divide-by-2 circuit 112, a buffer and level shifter (BLS) 114, and a programmable divider 116, all operatively coupled together as indicated. The system may be implemented, for example, as an integrated circuit or chipset using suitable semiconductor process technology (e.g., CMOS, etc), or as a number of discrete components configured on a printed circuit board or other suitable substrate. As will further be appreciated, the system may be part of a larger system, such as a microprocessor.

In general, the PFD 102 can be implemented with conventional technology, and receives a feedback version ($Clock_{fb}$) of the generated clock (tapped from the output of the Divide-by-2 circuit 112 and divided by N in this example embodiment) and compares its phase and/or frequency with that of reference clock signal ($Clock_{ref}$) to generate an error signal reflecting the phase/frequency difference. In addition to this conventional functionality, the PFD 102 in this example embodiment is enabled by a signal ($PFD_{enb}$, which is the inverted or complementary version of $PFD_{en}$) from the AFC circuit 110, as will be discussed in-turn. The resulting error signal reflecting the phase/frequency difference is used to generate a phase and/or frequency aligned version of the reference clock at the output ($Clock_{out}$) of the BLS 114. As will be appreciated, using a 'b' in signal nomenclature (e.g., $PFD_{enb}$) indicates that the signal is active low.

In more detail, the error signal generated by the PFD 102 comprises an Up signal that asserts if the $Clock_{ref}$ signal is ahead of the $Clock_{fb}$ signal and a Down signal that asserts if the $Clock_{fb}$ signal is ahead of the $Clock_{ref}$ signal. An assertion of the Up or Down signal from the PFD 102 charges or discharges the charge pump/loop filter 104 to appropriately raise or lower a VCO control voltage ($V_{ctl}$). This in-turn causes the LC-VCO 106 to increase or decrease the phase/frequency of its generated clock to adjust for the difference between the $Clock_{ref}$ and $Clock_{fb}$ signals. The Up and Down signals are also provided to the lock detector 103, which can be implemented with conventional technology and operates to generate the Lock signal as commonly done. The charge pump/loop filter 104 can also be implemented with conventional technology. In addition to this conventional functionality, the charge pump/loop filter 104 in this example embodiment can be tri-stated by a signal ($V_{ctl\_rst\_a}$) from the AFC circuit 110, as will be discussed in-turn.

The AFC circuit 110 receives the $V_{ctl}$ signal generated by the charge pump/loop filter 104, and is coupled to the LC-VCO 106 (via the $F_{ctl}$ signal) to control its frequency. The AAC circuit 108 is coupled to the LC-VCO 106 (via the $A_{ctl}$ signal) to control the amplitude of its generated signal. Note that, for simplicity sake, external signals such as control signals to the AFC and AAC circuits are not shown but may be employed for adjustable control of parameters within either circuit.

The AAC circuit 108 can be implemented with conventional technology, and in some embodiments may be used at startup to control the LC-VCO to generate a clock to have a desired target amplitude. Once reached, the AAC circuit 108 may be disengaged for steady state PLL operation to reduce jitter that could otherwise be caused by amplitude adjustments to the generated clock signal. Such disengagement is not required however. In other embodiments, it may be sporadically or continually engaged, depending on design concerns and the operational environment.

The LC-VCO 106 can generally be implemented with conventional technology, and generates a clock signal in response to the $V_{ctl}$, $F_{ctl}$ and $A_{ctl}$ signals. In addition to this conventional functionality, and in accordance with an embodiment of the present invention, LC-VCO 106 is further configured to compensate for post-lock variations in temperature in response to a compensation signal ($T_{comp}$). As will be appreciated in light of this disclosure, the $T_{comp}$ signal can be provided, for example, by logic internal to the AFC circuit 110 or the LC-VCO 106, or by a discrete dedicated circuit included in or otherwise accessible by the LC-PLL system. The LC-VCO 106 may be further configured with a number of capacitor loadings responsive to the $F_{ctl}$ signal, so as to further compensate for variations associated with process corners, voltages, temperature, input reference frequency, and other such variable parameters. Additional details of an example embodiment of the LC-VCO 106 will be provided with reference to FIG. 2.

The AFC circuit 110 of this example embodiment is configured to receive the $V_{ctl}$ signal and to automatically select (via the $F_{ctl}$ signal), during the locking process, one of the capacitor loadings of the LC-VCO 106 (e.g., based on process corners, voltage, temperature and input reference frequency). The AFC circuit 110 may be further configured with a programmable timer for providing a waiting time for the loop to settle down before the next counter moves. In addition, the control voltage $V_{ctl}$ of this example embodiment is limited to the linear range and the high gain region of frequency vs. control voltage curves as will be explained in-turn with reference to FIGS. 3 and 4. As will be appreciated in light of this disclosure, the AFC circuit 110 allows the frequency range of the LC-VCO 106 to be expanded (by N bits, depending on application) by compensating for or otherwise mitigating the effects of temperature variation. The overall compensation provided may mitigate the effects of other variable parameters as well, and may be instituted when acquiring lock and/or post-lock operations of the PLL system.

The clock signal generated by the LC-VCO 106 is fed into the divide-by-2 circuit 112, which produces a clock signal having half the frequency of that generated from the LC-VCO 106. As will be appreciated, such a divider block allows the LC-VCO 106 to operate at a higher frequency than the ultimately provided output clock frequency, which may be beneficial for various performance reasons (e.g., such as in cases where the VCO is more stable and/or accurate at higher frequencies). Other embodiments may not use a divider, or may use a different divider (e.g., divide by 4 circuit). Likewise, the programmable divider 116 can be used to adjust the frequency of the signal output by the divide-by-2 circuit 112, so that the frequency of the frequency of the generated Clock$_{fb}$ signal is suitable for the operation of PFD 102. The control for the programmable divider 116 can be provided as typically done. In other embodiments, the programmable divider 116 may be fixed or excluded. The generated clock is buffered and may be level shifted as necessary by BLS 114 to make it suitable for use in a given application (e.g., clock tree source, communications link, etc). The divide-by-2 circuit 112, the programmable divider 116, and the BLS 114 can each be implemented using conventional technology.

Note that while single lines are used for convenience, the actual signals are not necessarily so limited. For example, they may comprise one or more lines, such as with differential signals or multi-bit digital signals. Moreover, variations on this example configuration will be apparent in light of this disclosure. For instance, AAC 108 and AFC 110 are shown as discrete modules, but either or both may be integrated directly into LC-VCO 106. Likewise, post-VCO processing can vary and may include different or no frequency division and/or level-shifting, depending on the given application. In addition, other embodiments may not require the AAC circuit 108, depending upon particular design considerations and performance criteria. In addition, typical PLL system input signals, such as Reset and Clock$_{ref}$ signals may not be shown or may be provided to other modules in addition to those shown, as will be apparent. Also, and as will be appreciated, the true and/or complementary versions of signals may be used, depending on particulars of the application including the desired active logic state (active low or active high).

LC-VCO Configured with Temperature Compensation

Figure 2:
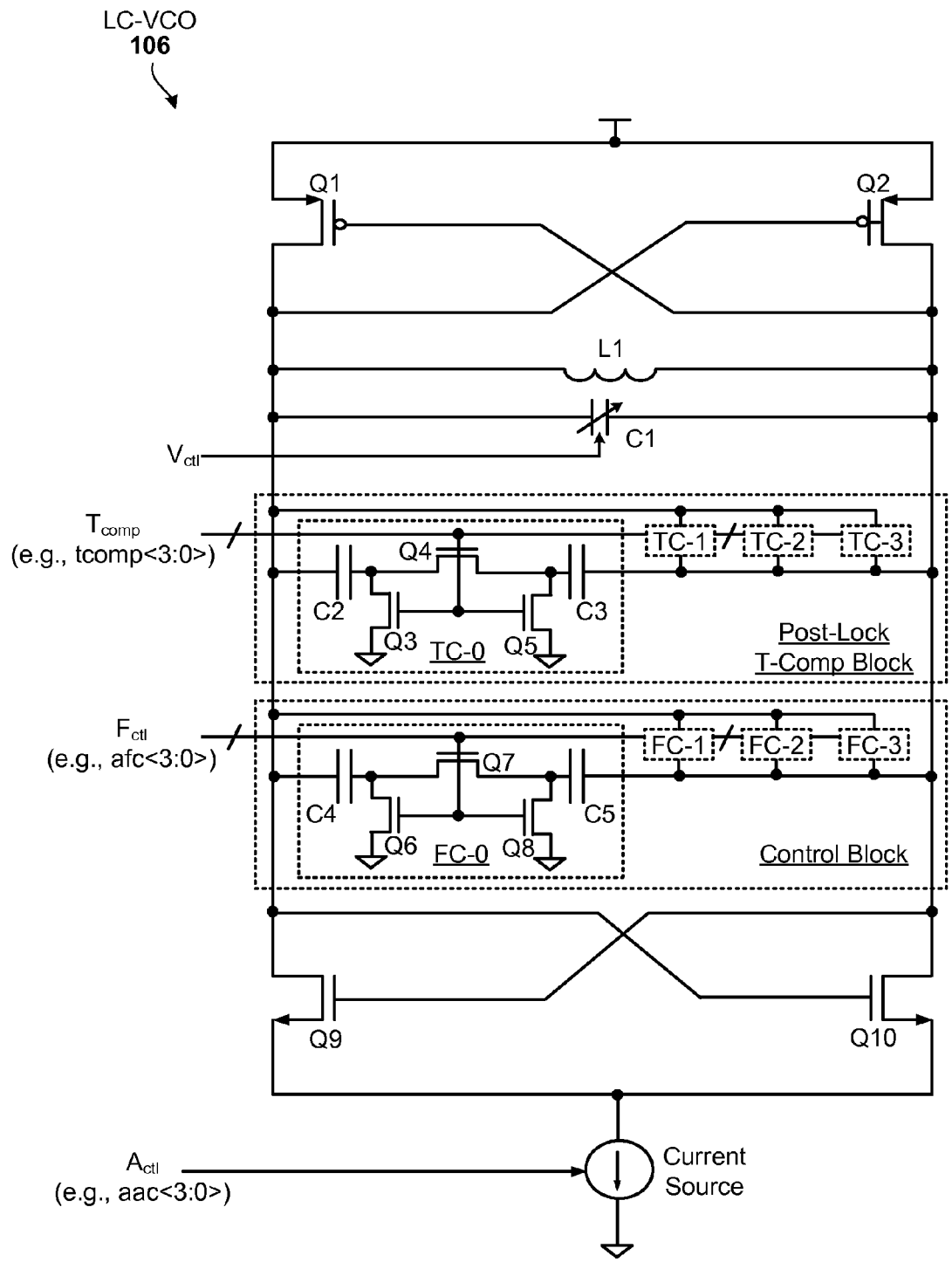
FIG. 2 is a schematic diagram an LC-VCO circuit configured in accordance with an embodiment of the present invention.

FIG. 2 is a schematic diagram an LC-VCO circuit configured in accordance with an embodiment of the present invention. As can be seen, the LC-VCO circuit 106 of this example embodiment is a differential configuration and includes cross-coupled n-type MOS (NMOS) Q9 and Q10 and p-type MOS (PMOS) Q1 and Q2 transistors to help sustain the oscillations. In more detail, transistor pairs Q1-Q2 and Q9-Q10 provide a negative resistance 1/Gm for canceling the resistance of inductor L1, which typically has a low Q and relatively high series resistance, so that the oscillation from the LC tank (L1 and C1) can sustain. Capacitor C1 is configured as a varactor that can be used for frequency fine tuning responsive to the $V_{ctl}$ signal. A current source responsive to the $A_{ctl}$ signal from AAC 108 provides biasing to the LC-VCO circuit 106 which allows for adjustment of the oscillation amplitude.

The LC-VCO circuit 106 of this example embodiment further includes a control block having multiple frequency control circuits (generally designated FC-0, FC-1, FC-2, and FC-3), each operatively coupled between the cross-coupled transistor pairs. These frequency control circuits FC-0, FC-1, FC-2, and FC-3 can be selectively engaged (or disengaged) based on the $F_{ctl}$ signal. In one specific example embodiment, the $F_{ctl}$ signal is four bits (designated as afc<3:0> in FIG. 2) and is binary coded to provide 16 different capacitor loading values that can be used for process variation compensation. This compensation can be employed as a form of coarse frequency tuning and can help mitigate, for instance, variations in process corners, voltage, temperature, and input reference signal frequency. Numerous other $F_{ctl}$ signal configurations can be used as well, depending on factors such as desired number of distinct capacitor loading values.

Each of the frequency control circuits FC-0, FC-1, FC-2, and FC-3 can be similarly configured, with one example shown for FC-0. As can be seen in this example configuration, transistors Q6, Q7, and Q8 are implemented with NMOS technology and turn-on in response to bit 0 of the 4-bit $F_{ctl}$ signal being logical high, which in-turn places the serial combination of capacitors C4 and C5 in circuit. Capacitors C4 and C5 can be implemented, for example, as metal finger capacitors (MFC) or any other suitable capacitor technology, and in one example embodiment are 20 femtofarads (ff) each, to provide a total serial capacitance of 10 ff for FC-0. Other embodiments may include different capacitance values for C4 and C5 depending on factors such as the frequency range of interest, the amount of capacitance being adjusted, the desired adjustment range, and coarseness of adjustment to be provided by that particular frequency control circuit. The other frequency control circuits (FC-1, FC-2, and FC-3) can operate in a similar fashion as described with respect to FC-0 but be configured with an appropriate binary weighted capacitance value (C4 and C5) based on the binary weight of the corresponding control bit of the $F_{ctl}$ signal.

For instance, and continuing with the example embodiment where FC-0 is responsive to bit 0 of the $F_{ctl}$ signal and provides a total serial capacitance of 10 ff, then FC-1 can be responsive to bit 1 of the $F_{ctl}$ signal to provide a total serial capacitance of 20 ff, FC-2 can be responsive to bit 2 of the $F_{ctl}$ signal to provide a total serial capacitance of 40 ff, and FC-3 can be responsive to bit 3 of the $F_{ctl}$ signal to provide a total serial capacitance of 80 ff. The total capacitance value from each active (switched-in) frequency control circuit operatively couple with one another in a parallel fashion. Table 1 demonstrates the overall capacitance provided for each of the 16 available coarse compensations, in accordance with one such example embodiment.

TABLE 1

| $F_{ctl}$ (b3 ... b0) | Active Frequency Control Circuits | Overall Capacitance (ff) |
|---|---|---|
| 0000 | none | 0 |
| 0001 | FC-0 | 10 |
| 0010 | FC-1 | 20 |

TABLE 1-continued

| $F_{ctl}$ (b3...b0) | Active Frequency Control Circuits | Overall Capacitance (ff) |
|---|---|---|
| 0011 | FC-1, FC-0 | 30 |
| 0100 | FC-2 | 40 |
| 0101 | FC-2, FC-0 | 50 |
| 0110 | FC-2, FC-1 | 60 |
| 0111 | FC-2, FC-1, FC-0 | 70 |
| 1000 | FC-3 | 80 |
| 1001 | FC-3, FC-0 | 90 |
| 1010 | FC-3, FC-1 | 100 |
| 1011 | FC-3, FC-1, FC-0 | 110 |
| 1100 | FC-3, FC-2 | 120 |
| 1101 | FC-3, FC-2, FC-0 | 130 |
| 1110 | FC-3, FC-2, FC-1 | 140 |
| 1111 | FC-3, FC-2, FC-1, FC-0 | 150 |

The LC-VCO circuit 106 of this example embodiment further includes a post-lock temperature compensation (T-Comp) block having multiple legs (generally designated TC-0, TC-1, TC-2, and TC-3), each leg operatively coupled between the cross-coupled transistor pairs. The legs of the compensation block can be selectively engaged (or disengaged) based on the $T_{comp}$ signal. In one specific example embodiment, the $T_{comp}$ signal is four bits (designated as tcomp<3:0> in FIG. 2) and is thermometer coded thereby allowing the four different capacitor legs (TC-0, TC-1, TC-2, and TC-3) to be sequentially switched-in (or switched-out) to provide post-lock temperature variation compensation. This in-turn effectively allows the frequency range of this example LC-VCO configuration to be expanded by 4-bits (one bit per capacitive leg). Note, however, and as will be appreciated in light of this disclosure, that other embodiments may include any number of capacitor legs to accommodate different post-lock frequency range expansion goals. The claimed invention is not intended to be limited to any particular expansion range.

In some embodiments, each of the temperature compensation circuits TC-0, TC-1, TC-2, and TC-3 can be similarly configured, with one example shown for TC-0. As can be seen in this example configuration, transistors Q3, Q4, and Q5 are implemented with NMOS technology and turn-on in response to bit 0 of the 4-bit $T_{comp}$ signal being logical high, which in-turn places the serial combination of capacitors C2 and C3 in circuit. Capacitors C2 and C3 can be implemented, for example, as MFCs or any other suitable capacitor technology, and in one example embodiment are 4 femtofarads (ff) each, to provide a total serial capacitance of 2 ff for TC-0. Other embodiments may include different capacitance values for C2 and C3 depending on factors such as the frequency range of interest, the amount of capacitance being adjusted, the desired adjustment range, and fineness of post-lock adjustment to be provided by that particular temperature compensation circuit. The other temperature compensation circuits (TC-1, TC-2, and TC-3) can operate in a similar fashion as described with respect to TC-0 but be configured with a desired total capacitance. For example, given a thermometer coding scheme, the total capacitance (C2 and C3) can be the same for all four temperature compensation circuits TC-0, TC-1, TC-2, and TC-3, but they need not be the same, as will be appreciated in light of this disclosure.

For instance, and continuing with the example embodiment where TC-0 is responsive to bit 0 of the $T_{comp}$ signal and provides a total serial capacitance of 2 ff, then TC-1 can be responsive to bit 1 of the $T_{comp}$ signal to provide a total serial capacitance of 2 ff, TC-2 can be responsive to bit 2 of the $T_{comp}$ signal to provide a total serial capacitance of 2 ff, and TC-3 can be responsive to bit 3 of the $T_{comp}$ signal to provide a total serial capacitance of 2 ff. The total capacitance value from each active (switched-in) temperature compensation circuit operatively couple with one another in a parallel fashion. Table 2 demonstrates the overall capacitance provided for each of the 5 available compensations, in accordance with one such example embodiment.

TABLE 2

| $T_{comp}$ (b3...b0) | Active Temperature Compensation Circuits | Overall Capacitance (ff) |
|---|---|---|
| 0000 | none | 0 |
| 0001 | TC-0 | 2 |
| 0011 | TC-1, TC-0 | 4 |
| 0111 | TC-2, TC-1, TC-0 | 6 |
| 1111 | TC-3, TC-2, TC-1, TC-0 | 8 |

In this example embodiment shown in Table 2, there are four thermometer code bits. In other embodiments, the number of thermometer coded bits can be, for example, 8 or 16. In a more general sense, and as will be appreciated in light of this disclosure, the number of the thermometer coded bits can vary as needed, depending on the temperature sensitivity of the LC-VCO 106.

A typical $Clock_{ref}$ signal is in the frequency range of 20 MHz to 200 MHz (e.g., $Clock_{ref}$ signal=100 MHz), although any desired $Clock_{ref}$ signal frequency can be used depending on the target application. For a desired $Clock_{ref}$ signal of 100 MHz and an inductor value of, for instance, 0.8 nH for L1, the capacitance range of varactor C1 can be selected accordingly to provide a range of fine tuning around that $Clock_{ref}$ frequency (generally, desired $Clock_{ref}=1/[2\pi\sqrt{LC}]$).

Thus, a combination of coarse and fine tuning can be implemented for both lock acquisition and post-lock operation, in accordance with an embodiment of the present invention. For instance, coarse tuning of the LC-VCO 106 frequency can be provided by adjusting the frequency control circuits FC-0, FC-1, FC-2, and FC-3 of the control block via the $F_{ctl}$ signal, and fine-tuning of the LC-VCO 106 frequency can be accomplished by adjusting the differential varactor C1. In addition, fine tuning of the VCO frequency can be accomplished by selectively engaging (or disengaging) the capacitor legs CL-0, CL-1, CL-2, and CL-3 of the post-lock temperature compensation block. Note that for the embodiments reflected in Tables 1 and 2, the capacitance range for coarse tuning provided by the control block is generally larger (in terms of capacitance) and does not overlap with the capacitance range for fine tuning provided by the post-lock temperature compensation block (i.e., coarse tuning 10 ff to 150 ff, fine tuning 2 ff to 8 ff). In one particular embodiment, and as will be explained in-turn, the temperature compensation block can be turned on or otherwise activated after lock is acquired and the AFC circuit 110 freezes.

AFC Circuitry

Figure 3:
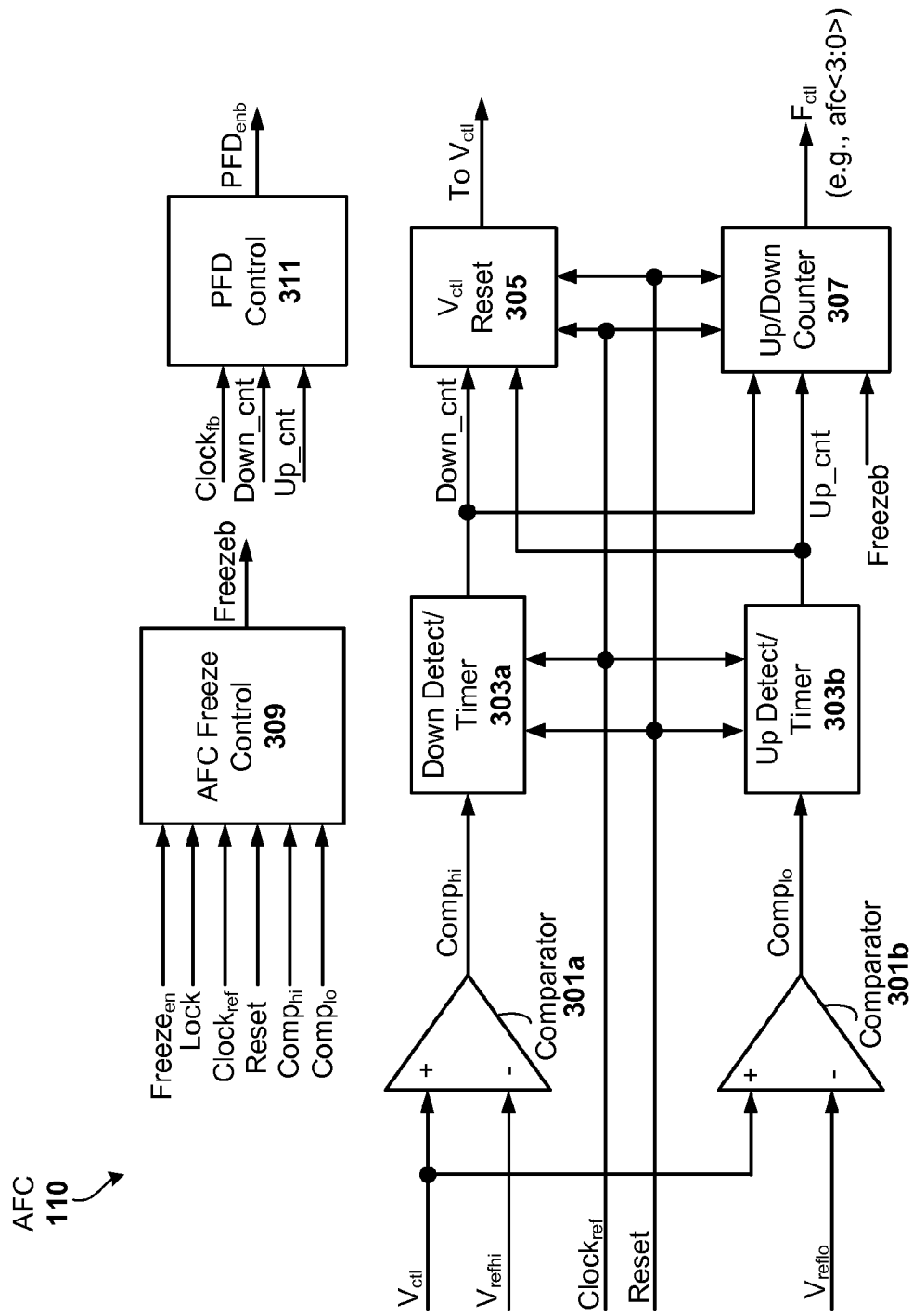
FIG. 3 is a block diagram an automatic frequency control (AFC) circuit configured in accordance with an embodiment of the present invention.

FIG. 3 is a block diagram an AFC circuit configured in accordance with an embodiment of the present invention. As can be seen, the AFC circuit 110 of this example embodiment includes a pair of comparators 301a and 301b operatively coupled to a down detect/timer 303a and an up detect/timer 303b, respectively. The AFC circuit 110 further includes a $V_{ctl}$ reset circuit 305, an up/down counter 307, an AFC freeze control circuit 309, and a PFD control circuit 311. As previously explained, the temperature compensation block of the LC-VCO 106 can be turned on or otherwise activated after lock is acquired and the AFC circuit 110 freezes, as indicated by the AFC freeze control circuit 309, and in accordance with some embodiments.

The comparators 301a and 301b can be implemented with conventional technology, and operate to compare the $V_{ctl}$ signal to $V_{reflhi}$ and $V_{reflo}$. Both $V_{reflhi}$ and $V_{reflo}$ can be generated for example, by a 2-bit digital-to-analog converter (DAC) that is adjustable with programmable bits thereby allowing for adjustment of $V_{reflhi}$ and $V_{reflo}$. Alternatively, $V_{reflhi}$ and $V_{reflo}$ can be fixed in value (e.g., based on voltage divider or other fixed voltage source provided at the appropriate inputs of the comparators 301a and 301b). In any case, the values of $V_{reflhi}$ and $V_{reflo}$ set the range for $V_{ctl}$, which limits $V_{ctl}$ to the relatively constant VCO gain region of the F-V curves.

The down detect/timer 303a and up detect/timer 303b, which can also be implemented with conventional technology, operate to sample the $Comp_{hi}$ and $Comp_{lo}$ signals output by the comparators 301a and 301b at a desired sampling rate. In one specific embodiment, the down detect/timer 303a and up detect/timer 303b are each implemented with a flip-flop configured to sample the $Comp_{hi}$ and $Comp_{lo}$ signals every 32 cycles of the $Clock_{ref}$ signal, where $Clock_{ref}$ equals 100 MHz. As can be further seen, each of the down detect/timer 303a and up detect/timer 303b receive the $Clock_{ref}$ and Reset signals to facilitate this periodic sampling (e.g., flip-flop configuration where Reset signal triggers sampling of output signal from comparator 303a/b every N cycles of $Clock_{ref}$ signal). The desired number of $Clock_{ref}$ signal cycles to wait can be fixed or programmable. The $Clock_{ref}$ and Reset signals (as well as their respective complements) can be generated, for example, from outside of the LC-PLL system, such as by a motherboard or other such application specific hardware.

The up/down counter 307, which can also be implemented with conventional up/down counter technology, receives the output signals of the down detect/timer 303a and the up detect/timer 303b (Down_cnt and Up_cnt, respectively) along with the $Clock_{ref}$ and Reset signals and a Freezeb (which is the inverted version of the Freeze signal) signal generated by AFC freeze control circuit 309, and generates the $F_{ctl}$ signal. In one example embodiment, the up/down counter 307 is implemented with a 4-bit up and down counter, although other configurations will be apparent in light of this disclosure. The AFC freeze control circuit 309 that provides the Freezeb signal (and its complement) will be further discussed with reference to FIGS. 6a and 6b.

Figure 4:
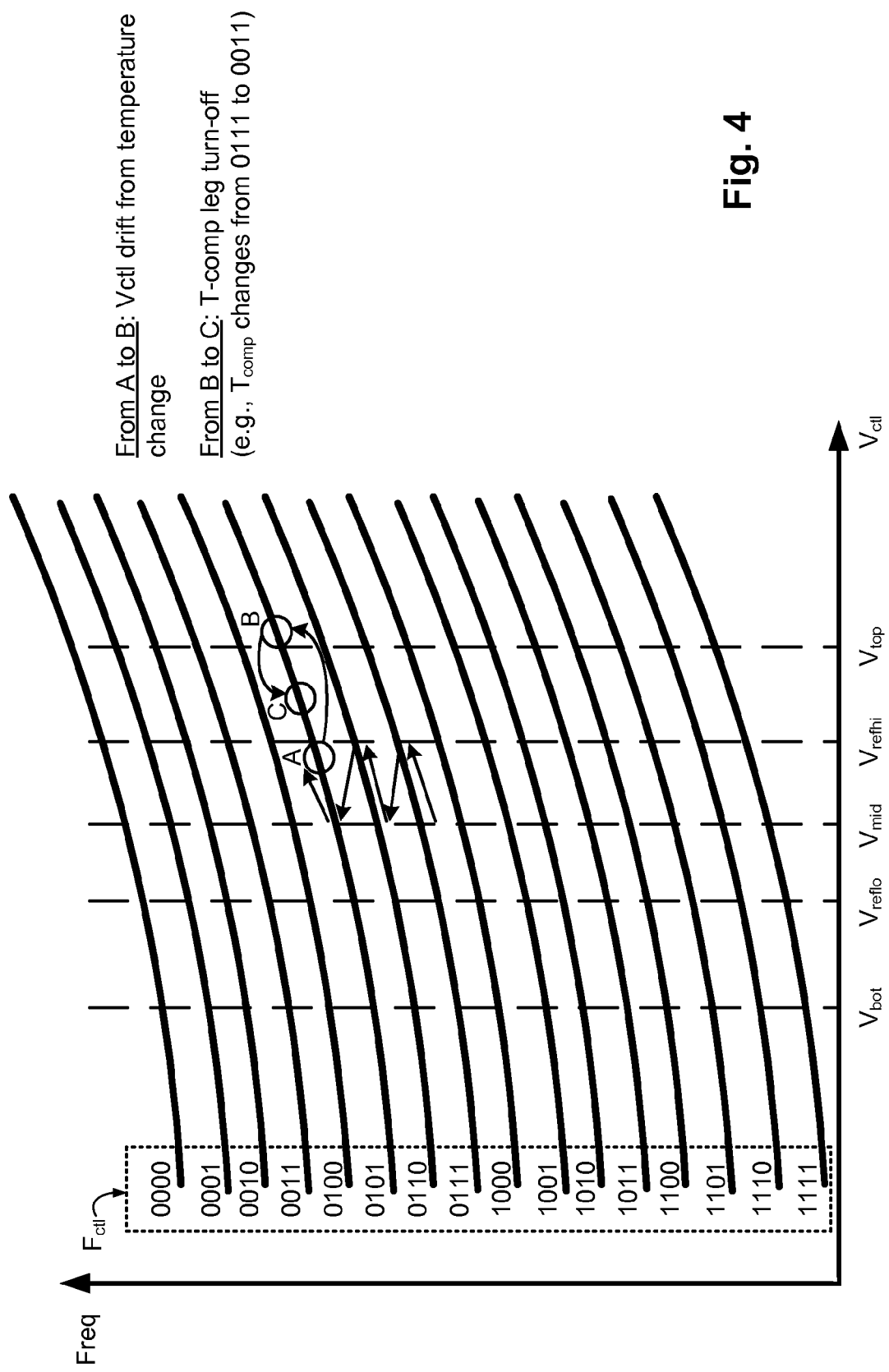
FIG. 4 illustrates a set of frequency vs. control voltage curves and demonstrates an LC-VCO locking process in accordance with an embodiment of the present invention.

Operation of the AFC circuit 110 will be further understood with reference to FIG. 4, which illustrates a set of frequency vs. control voltage curves and demonstrates an LC-VCO locking process in accordance with an embodiment of the present invention. The LC-VCO 106 gain is mainly determined by the varactor capacitance C1 vs. $V_{ctl}$ characteristics. In accordance with one example embodiment implemented with CMOS process technology, the LC-VCO 106 linear frequency vs. $V_{ctl}$ (F-V) curve region is approximately from $V_{reflo}$ (0.3V to 0.4 V) to $V_{reflhi}$ (0.7V or 0.8V) for a nominal supply voltage of 1.1V ($V_{cc}$). As best shown in the example of FIG. 4, the LC-PLL system can be initialized to start the locking process with $V_{ctl}=V_{mid}$ and with $F_{ctl}=0111$ (roughly, the middle of the $F_{ctl}$ range in this example). $V_{mid}$, which can be adjusted by register bits or fixed, is 0.5V in this specific example.

If the $Clock_{fb}$ signal frequency is lower than the $Clock_{ref}$ signal frequency, then $V_{ctl}$ is pulled high by the charge pump/loop filter 104. Once $V_{ctl}$ is higher than $V_{reflhi}$ for a specified waiting time period (e.g., programmable by register bits or fixed), the up/down counter 307 decreases one bit (meaning that, in the example shown in FIG. 4, $F_{ctl}$ changes from its initial setting of 0111 to the next lower count of 0110), and $V_{ctl}$ is reset to $V_{mid}$ (e.g., 0.5V). The LC-PLL system then starts locking on the F-V curve labeled by 0110, as further shown in FIG. 4. If the $Clock_{ref}$ signal frequency is still higher than the $Clock_{fb}$ signal frequency, the up/down counter 307 will decrease one bit at a time until the PLL locks. As can be seen in the example shown in FIG. 4, the LC-PLL system locks on F-V curve associated with an $F_{ctl}$ of 0101. The purpose of a waiting time (e.g., provided by detect/timers 303a and 303b, as previously explained) is to allow any $V_{ctl}$ overshoot/undershoot to settle down before $V_{ctl}$ is compared with $V_{reflhi}$ and $V_{reflo}$, which ensures the correct F-V curve is used. At the end of waiting period, if $V_{ctl}$ is still higher than $V_{reflhi}$, $V_{ctl}$ is pulled down to $V_{mid}$ while the up/down counter 307 steps down one bit.

Thus, when $V_{ctl}$ is higher than $V_{reflhi}$ for a specified waiting time period, the up/down counter 307 jumps to next higher frequency band and $V_{ctl}$ is pulled down to $V_{mid}$, and the loop starts the locking process again. Note that the relative phase between the $Clock_{ref}$ signal and the $Clock_{fb}$ signal may be arbitrary at this point in time. Further note that when $V_{ctl}$ is lower than $V_{reflo}$ for the specified waiting time period, the up/down counter 307 can jump to next lower frequency band and $V_{ctl}$ is pulled up to $V_{mid}$, and the loop starts the locking process again in a similar fashion. The locking process can be started at, for example, the lowest F-V curve, which facilitates acquiring lock in the linear/high gain region of the F-V curve. In such cases, at each AFC counter update, the $V_{ctl}$ can be initialized to a reference voltage $V_{mid}$, and pumps up from $V_{mid}$.

In one example embodiment, the PFD control circuit 311 operates to enable the PFD 102 (via the $PFD_{enb}$ signal) before the next rising edge of the $Clock_{ref}$ signal, so that the charge pump 104 pulls $V_{ctl}$ higher, and to allow for relatively fast locking in the linear region of the F-V curve. When the up/down counter 307 switches from N to N−1 or N+1 (e.g., where N=1 to 16), the $V_{ctl}$ reset circuit 305 is configured to reset $V_{ctl}$ (e.g., to $V_{cc}/2$) for M cycles of $Clock_{ref}$, which initializes the PLL locking process. The $V_{ctl}$ reset circuit 305 and the PFD control circuit 311 will be further discussed with reference to FIGS. 7 and 8, respectively.

As can further be seen with reference to FIG. 4, a change in temperature (e.g., caused by external temperature changes and/or heat generated from the local circuitry) can cause $V_{ctl}$ to drift. In this example, after lock is acquired at $F_{ctl}=0101$, $V_{ctl}$ drifts from point A (just under $V_{reflhi}$) to point B (just above $V_{top}$). In accordance with an embodiment of the present invention, this shift in $V_{ctl}$ can be corrected for or otherwise compensated by adjusting the $T_{comp}$ signal to disengage a leg of the post-lock T-comp block. In the example shown, this entails changing a thermometer coded $T_{comp}$ signal from 0111 to 0011. Per the Table 2 example, this change in the $T_{comp}$ signal changes the overall capacitance switched-in via the T-comp block from 24 ff to 16 ff.

Figure 5:
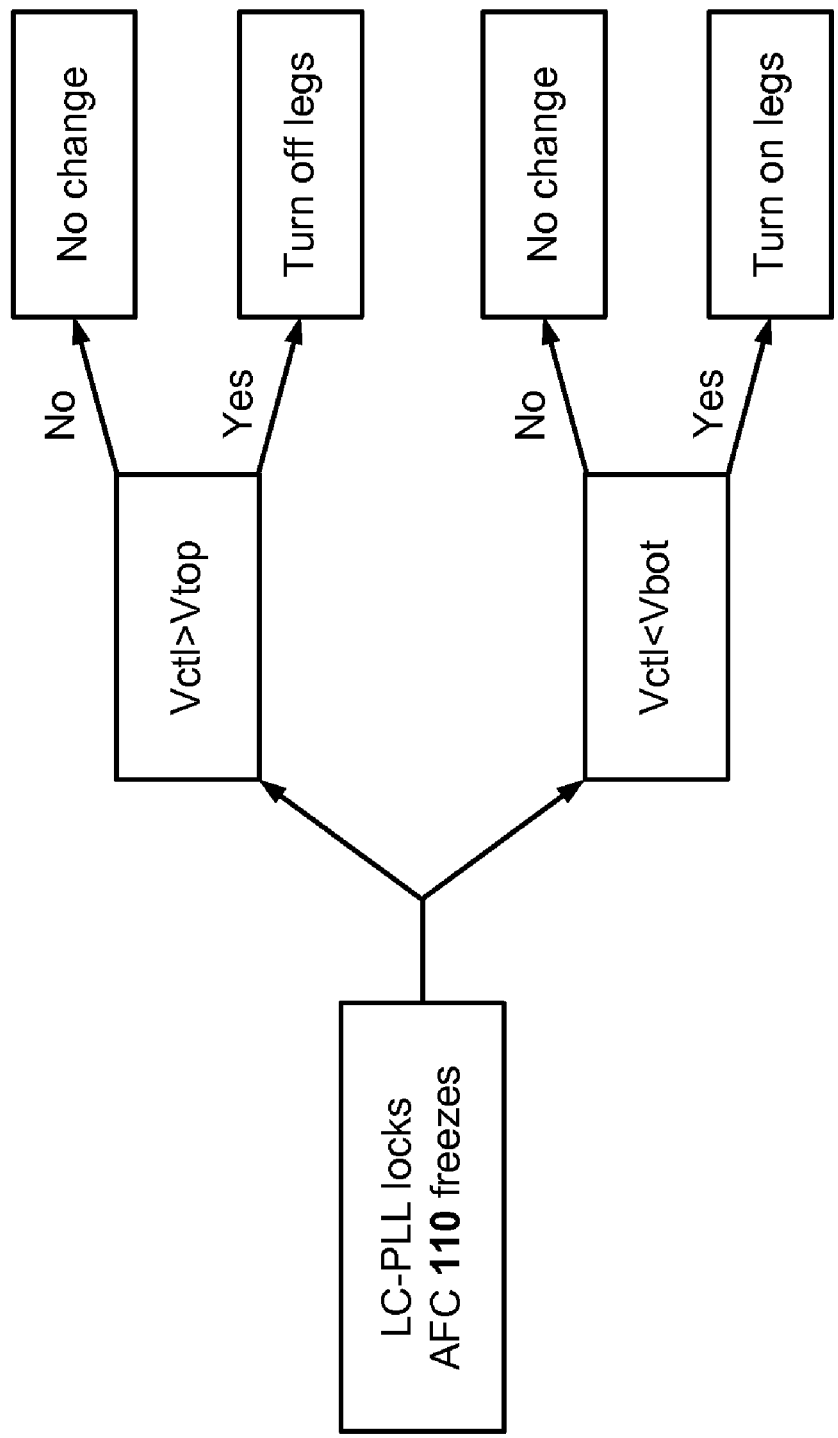
FIG. 5 demonstrates example T-comp block control logic used for temperature compensation in accordance with an embodiment of the present invention.

FIG. 5 demonstrates example T-comp block control logic used for post-lock temperature compensation in accordance with an embodiment of the present invention. As can be seen with the example embodiment, the preliminary assessment by the control logic is two fold. In particular, a determination is made as to whether lock has been achieved by the LC-PLL system and whether the AFC 110 freeze is enabled. If either of these conditions is not met, then post-lock temperature compensation need not be adjusted or otherwise changed from its current state.

However, if both conditions are satisfied, then the control logic operates to make two subsequent determinations. In particular, a determination is made as to whether $V_{ctl}$ is greater than $V_{top}$. If so, then the next sequential capacitive leg of the T-comp block is turned-off or otherwise disengaged to effectively lower $V_{ctl}$ back to an acceptable level. However, if $V_{ctl}$ is not greater than $V_{top}$, then no capacitive legs of the T-comp block are turned-off. In addition, a determination is made as to whether $V_{ctl}$ is lower than $V_{bot}$. If so, then the next sequential capacitive leg of the T-comp block is turned-on or otherwise engaged to effectively raise $V_{ctl}$ back to an acceptable level. However, if $V_{ctl}$ is not lower than $V_{bot}$, then no capacitive legs of the T-comp block are turned-on. This T-comp block control process can be periodically repeated as needed.

Thus, an in accordance with one example embodiment, the frequency range of the LC-VCO 106 can be widened by 4 bits (but not limited by 4 bits) of binary weighted MFCs. Both $V_{refhi}$ and $V_{reflo}$ can be generated by a DAC that is adjustable with programmable bits, and their values set the range of $V_{ctl}$, which effectively limits $V_{ctl}$ to the relatively constant VCO gain region of the F-V curves (e.g., for CMOS technology, 0.3V to 0.8v for a supply voltage of 1.1V). The LC-PLL can be initialized to start the locking process with $V_{ctl}=V_{mid}$, with $F_{ctl}<3:0>=0111$. If the Clock$_{fb}$ signal frequency is lower than the Clock$_{ref}$ signal frequency, $V_{ctl}$ is pulled high by the charge pump 104. Once $V_{ctl}$ is higher than $V_{refhi}$ for a specified waiting time period that can be programmable by register bits or fixed, the up/down counter 307 decreases one bit (e.g., $F_{ctl}<3:0>$ changes from 0111 to 0110), and $V_{ctl}$ is reset to $V_{mid}$. The LC-PLL system then starts the locking process on the F-V curve associated with that new decremented $F_{ctl}$ signal. If the Clock$_{ref}$ signal frequency is still higher than the Clock$_{fb}$ signal frequency, the counter 307 will continue to decrease one bit at a time until lock is achieved. A waiting time is provided to allow any $V_{ctl}$ overshoot/undershoot or other transient signals to settle down before $V_{ctl}$ is compared with $V_{refhi}$ and $V_{reflo}$, thereby avoiding incorrect F-V curve selection. At the end of waiting period, if $V_{ctl}$ is higher than $V_{refhi}$, Vctl is pulled down to $V_{mid}$ while counter 307 steps down one bit. The value of $V_{mid}$ can be adjusted by register bits. After the loop is locked (e.g., as indicated by lock detector 103 output going high), and $V_{ctl}$ is within the range set by $V_{reflo}$ and $V_{refhi}$, the AFC circuit 110 enters the freeze mode after a waiting period. After counter 307 freezes, $V_{ctl}$ stays locked on one F-V curve. If the temperature increases (e.g., from 0° C. to 100° C., or any other temperature change) after lock, the $V_{ctl}$ will increase along the curve F-V curve to remain locked at the target frequency. If the LC-VCO 106 frequency dependence on temperature is small, the change in frequency is small and $V_{ctl}$ drift is small, and therefore temperature compensation as provided herein may not be needed. However, in other cases prone to temperature sensitivity (such as CMOS processes scaled down to 45 nm node, where varactor and gate capacitance dependence on temperature becomes stronger), such a 100° C. temperature change can push the operating point of the LC-PLL system out of the F-V curve linear region generally defined by $V_{bot}<V_{ctl}<V_{top}$. This in-turn may result, for instance, in lower loop bandwidth or losing lock. In this sense, the tuning based on the $F_{ctl}$ signal can be thought as a coarse tuning of frequency (to pick the correct frequency band for lock), and the tuning based on the $T_{comp}$ signal can be thought as a fine tuning of frequency (to stay on the correct frequency band, despite changes in parameters such as temperature). The post-lock T-comp block is configured with capacitive legs (e.g., MFCs or other suitable capacitive elements) to fine tune the LC-VCO 106 and keep the operating point within the F-V linear region. The total capacitance provided by any one leg may be in the range of, for example, 1 ff to 10 ff, or otherwise small enough to not add deterministic jitters as a result of the let being engaged/disengaged. Once $V_{ctl}$ goes above $V_{top}$ (or below $V_{bot}$), the capacitive legs in the T-comp block start to turn-off (or turn-on), thereby reducing (or increasing) the total tank capacitance and cancelling the capacitance increase (or decrease) caused by temperature, which in-turn pushes $V_{ctl}$ back to the F-V linear region defined by $V_{bot}<V_{ctl}<V_{top}$. The T-comp block operates in response to the $T_{comp}$ signal, which can be thermometer coded. Before the locking process starts, the T-comp block can be initialized, for instance, with half of the legs on and half of the legs off. Such an initial setting will accommodate suitable compensation for the case where loop locks at a low temperature and then temperature goes up, as well as the case where the loop locks at high temperature and then temperature goes down.

Freeze Control Circuitry

Figure 6A:
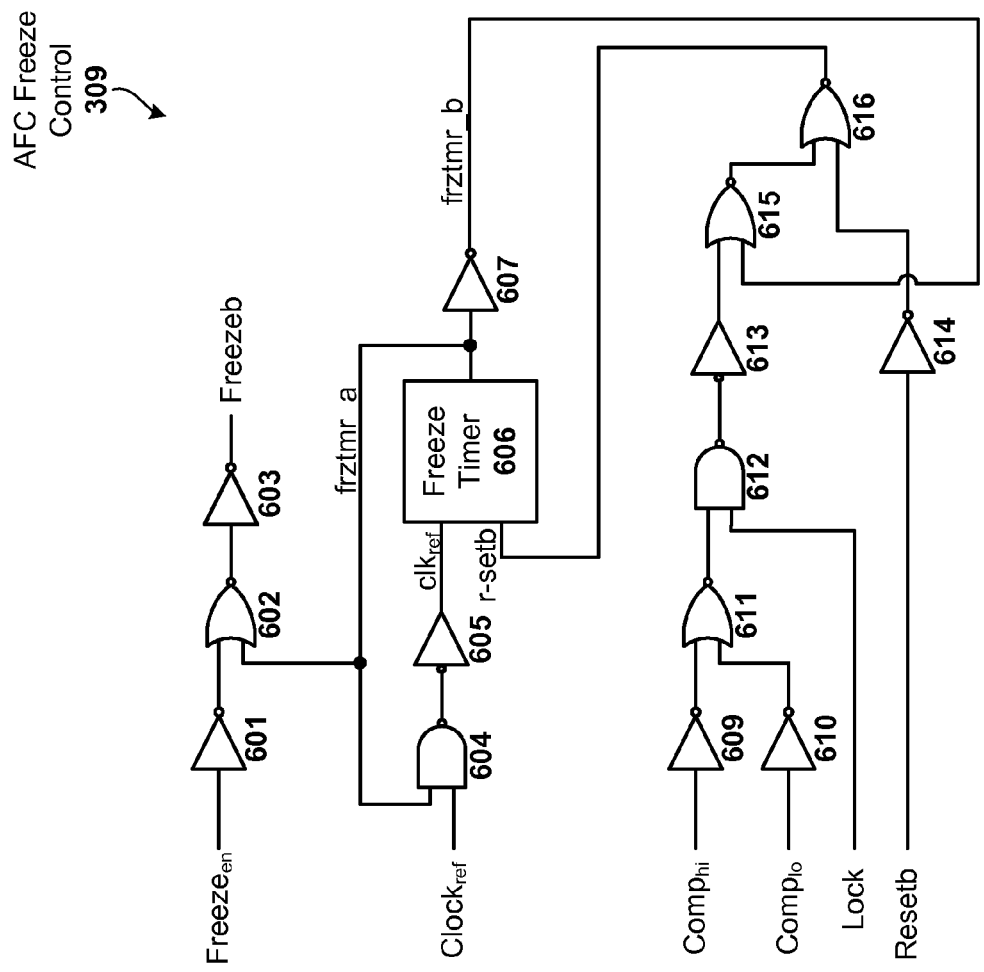
FIG. 6a is a schematic diagram an AFC freeze control circuit configured in accordance with an embodiment of the present invention.

FIG. 6a is a schematic diagram an AFC freeze control circuit configured in accordance with an embodiment of the present invention. As can be seen, the AFC freeze control circuit 309 of this example embodiment includes a number of logic gates operatively coupled with a timer circuit. Other AFC freeze control circuits will be apparent in light of this disclosure, and the claimed invention is not intended to be limited to any specific one or set of AFC freeze control circuit configurations. In the specific example, the input signals to the AFC freeze control circuit 309 include a Freeze$_{en}$ signal, the Clock$_{ref}$ signal, the Comp$_{hi}$ and Comp$_{lo}$ signals, the Lock signal, and the Resetb signal (which is the inverted version of the Reset signal). The output signal of the AFC freeze control circuit 309 is the Freezeb signal.

In more detail, the Resetb signal is received by inverter 614, the output of which is provided to one input of NOR-gate 616. The other input of NOR-gate 616 is derived from a series of gates driven by the Comp$_{hi}$, Comp$_{lo}$, and Lock signals. In particular, inverter 609 receives the Comp$_{hi}$ signal and inverter 610 receives the Comp$_{lo}$ signal, and the output of these two inverters drive NOR-gate 611. The output of NOR-gate 611 drives one input of NAND-gate 612 and the Lock signal drives the other input of NAND-gate 612. The output of NAND-gate 612 drives buffer 613, which in-turn drives on input of NOR-gate 615, which in-turn drives the other input of NOR-gate 616. The other input of NOR-gate 615 is provided by the timer portion of the circuit 309. In particular, the Clock$_{ref}$ signal is received at one input of NAND-gate 604 and an internal signal frztmr_a drives the other input of NAND-gate 604. The output of NAND-gate 604 drives the input of buffer 605, which in-turn drives the clock reference (clk$_{ref}$) input of freeze timer 606. The reset input of the freeze timer 606 is driven by the output of the NOR-gate 616, which is r-setb in this case (the complement of r-set). The freeze timer 606, which will be discussed in further detail with reference to FIG. 6b, generates the internal signal frztmr_a, which further drives the input of inverter 607 which generates the internal signal frztmr_b, which is provided to the other input of NOR-gate 615. The optional Freeze$_{en}$ signal can be provided, for example, from a programmable memory block or bit register associated with the LC-PLL system, such as memory of a microprocessor or chip in which the LC-PLL system operates. In one such case, the memory or register can be programmed before the chip is sold for particular application. In other cases, the Freeze$_{en}$ signal can be tied to the desired logic state (e.g., ground or $V_{cc}$). In other embodiments, the Freeze$_{en}$ signal can be set to its active state in a timely fashion during operation, such as some time after lock is acquired. The Freeze$_{en}$ signal drives the input of inverter 601, which in-turn drives one input of NOR-gate 602. The other input of NOR-gate 602 is driven by the internal signal frztmr_a. The output of NOR-gate 602 drives inverter 603, which generates the Freezeb signal. In operation, when the Freeze$_{en}$ signal=1 (logic high), Lock signal=1 (PLL locks), Comp$_{hi}$ and Comp$_{lo}$ each=1 ($V_{reflo}$<$V_{ctl}$<$V_{refhi}$), the Freezeb signal will go low after six clock cycles in this example embodiment. When Freezeb signal=0 (logic low), automatic frequency control effectively freezes. At this point, $V_{ctl}$ will be limited to move on only one $F_{ctl}$ settings (e.g., such as one of the 16 $F_{ctl}$ values shown in Table 1).

Figure 6B:
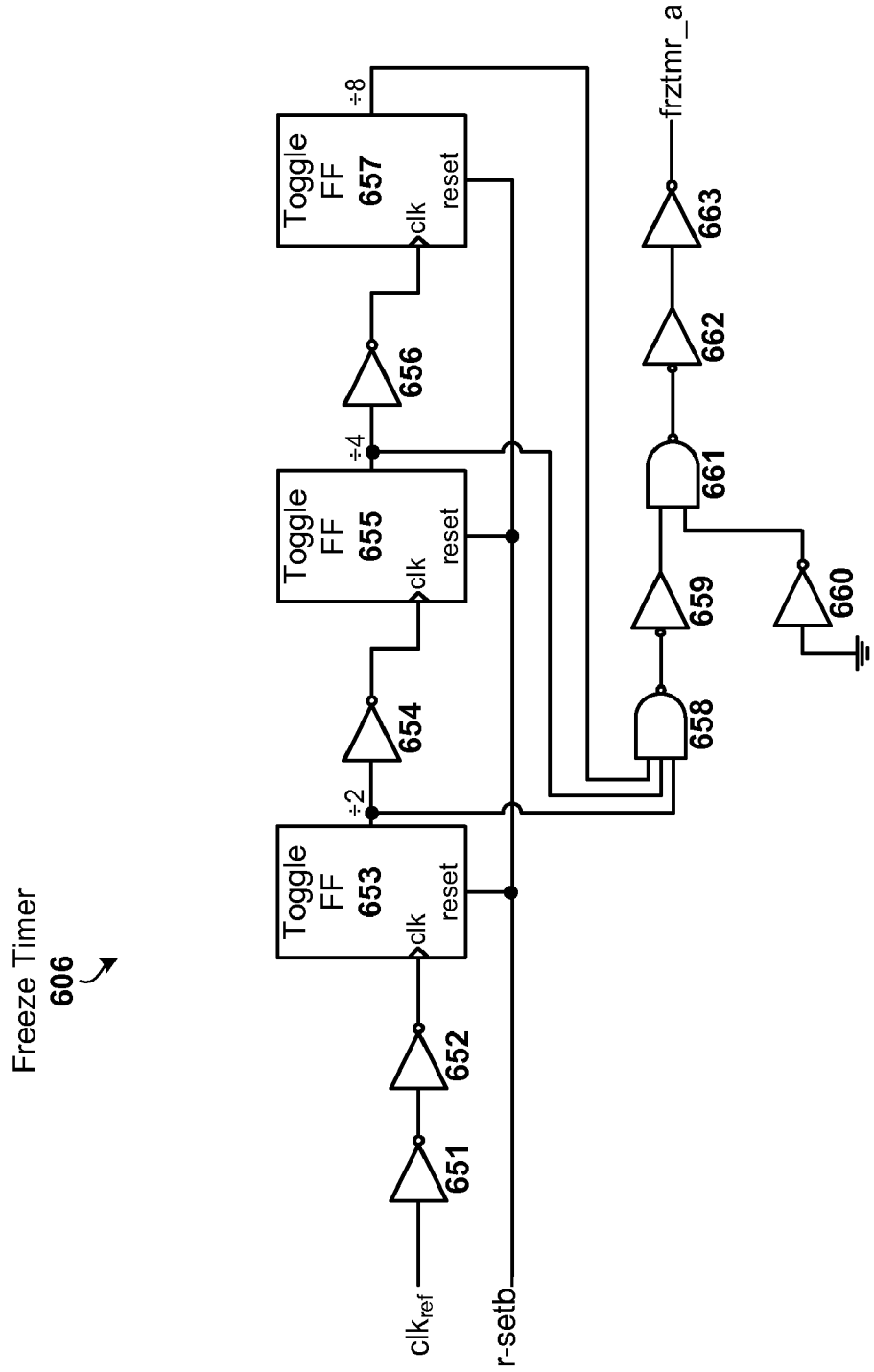
FIG. 6b is a schematic diagram a freeze timer circuit configured in accordance with an embodiment of the present invention.

FIG. 6b is a schematic diagram a freeze timer circuit configured in accordance with an embodiment of the present invention. As can be seen, the freeze timer circuit 606 of this example embodiment includes a number of logic gates and three toggle-type flip-flops. In general, the flip-flops each divide the input clock signal by two to provide ÷2, ÷4, and ÷8 outputs at the respective flip-flop outputs. The logic inverters at the inputs of the flip-flops provide additional delay and prepare the clock signal for next stage. Other freeze timer circuits will be apparent in light of this disclosure (depending on factors such as reference clock frequency and desired delay), and the claimed invention is not intended to be limited to any specific one or set of freeze timer circuit configurations.

In the specific example, the input signals to the freeze timer circuit 606 include the clk$_{ref}$ signal (from buffer 605) and the r-setb signal (from NOR-gate 616). The output signal of the freeze timer circuit 606 is the frztmr_a signal, which is used by the AFC freeze control circuit 309 as previously described. The clk$_{ref}$ signal signal is received by inverter 651, which drives inverter 652, which drives the clock input of toggle flip-flop 653. The output signal of the flip-flop 653 in this example has a frequency that is one-half the clk$_{ref}$ signal frequency (÷2 stage), and drives inverter 654, which in-turn drives toggle flip-flop 653. The output signal of the flip-flop 655 in this example has a frequency that is one-quarter the clk$_{ref}$ signal frequency (÷4 stage), and drives inverter 656, which in-turn drives toggle flip-flop 657. The output signal of the flip-flop 657 in this example has a frequency that is one-eighth the clk$_{ref}$ signal frequency (÷8 stage). Each of the outputs from the ÷2 stage, ÷4 stage, and ÷8 stage are provided as inputs to NAND-gate 658, which drives buffer 659, which in-turn drives one input of NAND-gate 661. The other input of NAND-gate 661 is driven by inverter 660, which has its input tied to logic low (ground, or 0V in this example case). The output of NAND-gate 661 drives buffer 662, which in-turn drives inverter 663, which outputs the frztmr_a signal. In operation, and in accordance with one embodiment, the frztmr_a signal goes to logic low when the outputs from each of the ÷2, ÷4, and ÷8 stages are all at logic high.

$V_{ctl}$ Reset Circuitry

Figure 7:
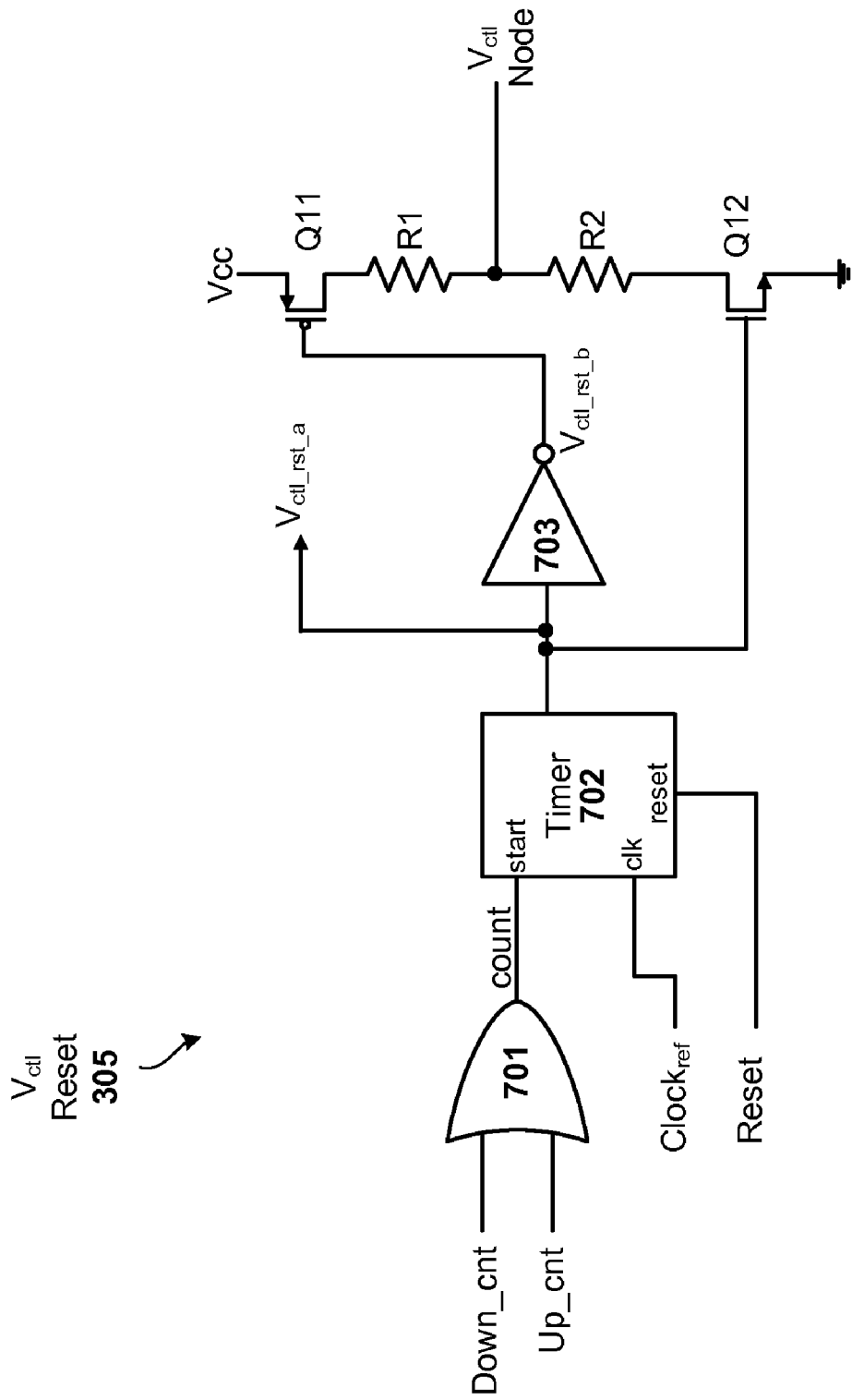
FIG. 7 is a schematic diagram a control voltage reset circuit configured in accordance with an embodiment of the present invention.

FIG. 7 is a schematic diagram a $V_{ctl}$ reset circuit 305 configured in accordance with an embodiment of the present invention. As can be seen in this example, the Down_cnt and Up_cnt signals (from the down detect/timer 303a and the up detect/timer 303b) are received by OR-gate 701, which generates a count signal that drives the start input of the timer 702, which is in-turn responsive to the Clock$_{ref}$ and Reset signals as shown. The timer 702 can be implemented, for example, in a similar fashion to the freeze timer 606, depending on the desired timing. Other timer circuits can be used as well, as will be apparent in light of this disclosure. The output of the timer 702 provides the $V_{ctl\_rst\_a}$ signal which drives the inverter 703 which in-turn produces the complement $V_{ctl\_rst\_b}$ signal. The $V_{ctl\_rst\_a}$ signal also drives the gate of NMOS transistor Q12 and is further provided to the PFD control circuit 311 and the charge pump/loop filter 104 as will be discussed in-turn. The $V_{ctl\_rst\_b}$ signal drives the gate of PMOS transistor Q11. Resistors R1 and R2 are serially connected between transistors Q11 and Q12, with the $V_{ctl}$ node connected between resistors R1 and R2. Other $V_{ctl}$ reset circuit configurations will be apparent in light of this disclosure (depending on factors such as reference clock frequency and desired range of $V_{ctl}$), and the claimed invention is not intended to be limited to any specific one or set of $V_{ctl}$ reset circuit configurations.

In operation, and in accordance with one embodiment, when either Down_cnt and Up_cnt signals go to 1 (logic high), which in-turn causes the up/down counter 307 to switch from N to N−1 or N+1, the timer 702 output (the $V_{ctl\_rst\_a}$ signal) goes active. Thus, the charge pump/loop filter 104 is tri-stated or otherwise disabled to provide an effective high impedance at the $V_{ctl}$ node (e.g., via the $V_{ctl\_rst\_a}$ signal as shown, or a charge pump control block responsive to a count change at the output of circuit 307). This allows the $V_{ctl}$ reset circuit 305 to pull the $V_{ctl}$ node to one-half $V_{cc}$, by way of the resistive divider formed with Resistors R1 and R2 when the output of timer 702 goes active (logic high in this example case) and turns on transistors Q11 and Q12. In this example, the $V_{ctl}$ node is held at $V_{cc}/2$ for four Clock$_{ref}$ cycles, which initializes the PLL locking process on a new F-V curve setting.

PFD Control Circuitry

Figure 8:
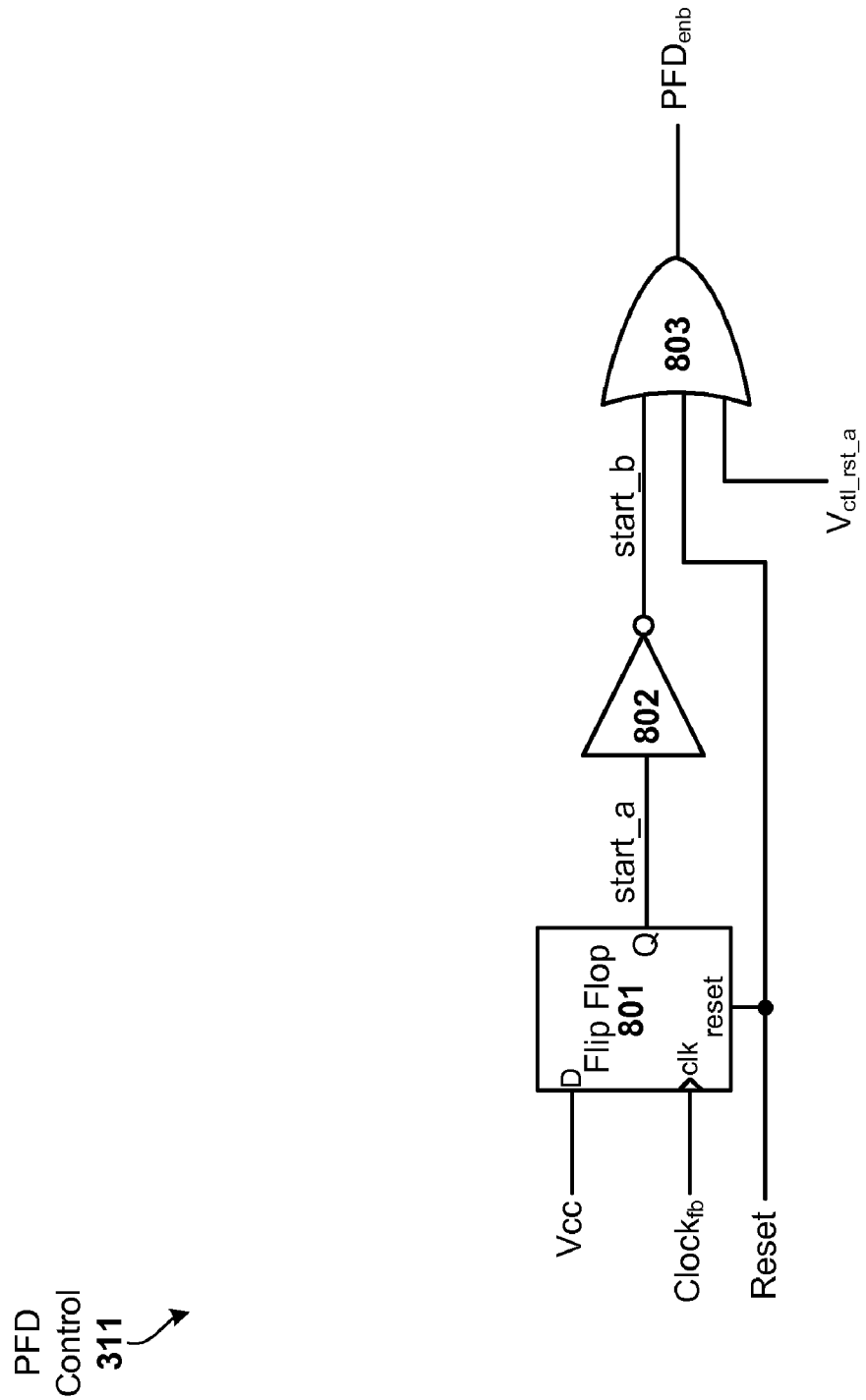
FIG. 8 is a schematic diagram a phase-frequency detector (PFD) control circuit configured in accordance with an embodiment of the present invention.

FIG. 8 is a schematic diagram a PFD control circuit 311 configured in accordance with an embodiment of the present invention. As can be seen in this example embodiment, the nominal voltage supply $V_{cc}$ drives the data (D) input of the flip-flop 801, which is in-turn responsive to the Clock$_{fb}$ and Reset signals as shown. The output (Q) of the flip-flop 801 provides the start_a signal which drives the inverter 802 which in-turn produces the complement start_b signal. The start_b signal is received at one input of OR-gate 803, which also receives the Reset and $V_{ctl\_rst\_a}$ signals as input and generates PFD$_{enb}$ signal. Other PFD control circuit configurations will be apparent in light of this disclosure (depending on factors such as fed back reference clock frequency and signal timing considerations), and the claimed invention is not intended to be limited to any specific one or set of PFD control circuit configurations.

In operation, and in accordance with one embodiment, when either Down_cnt and Up_cnt signals go to 1 (logic high), which in-turn causes the up/down counter 307 to switch from N to N−1 or N+1, the timer 702 output (the $V_{ctl\_rst\_a}$ signal) goes active. Thus, the charge pump/loop filter 104 is tri-stated or otherwise disabled as previously described. In addition, the PFD control circuit 311 shares $V_{ctl\_rst\_a}$ signal to disable/enable the PFD circuit 102, to further avoid contention between charge pump 104 and resistor divide (R1 and R2).

Figure 9:
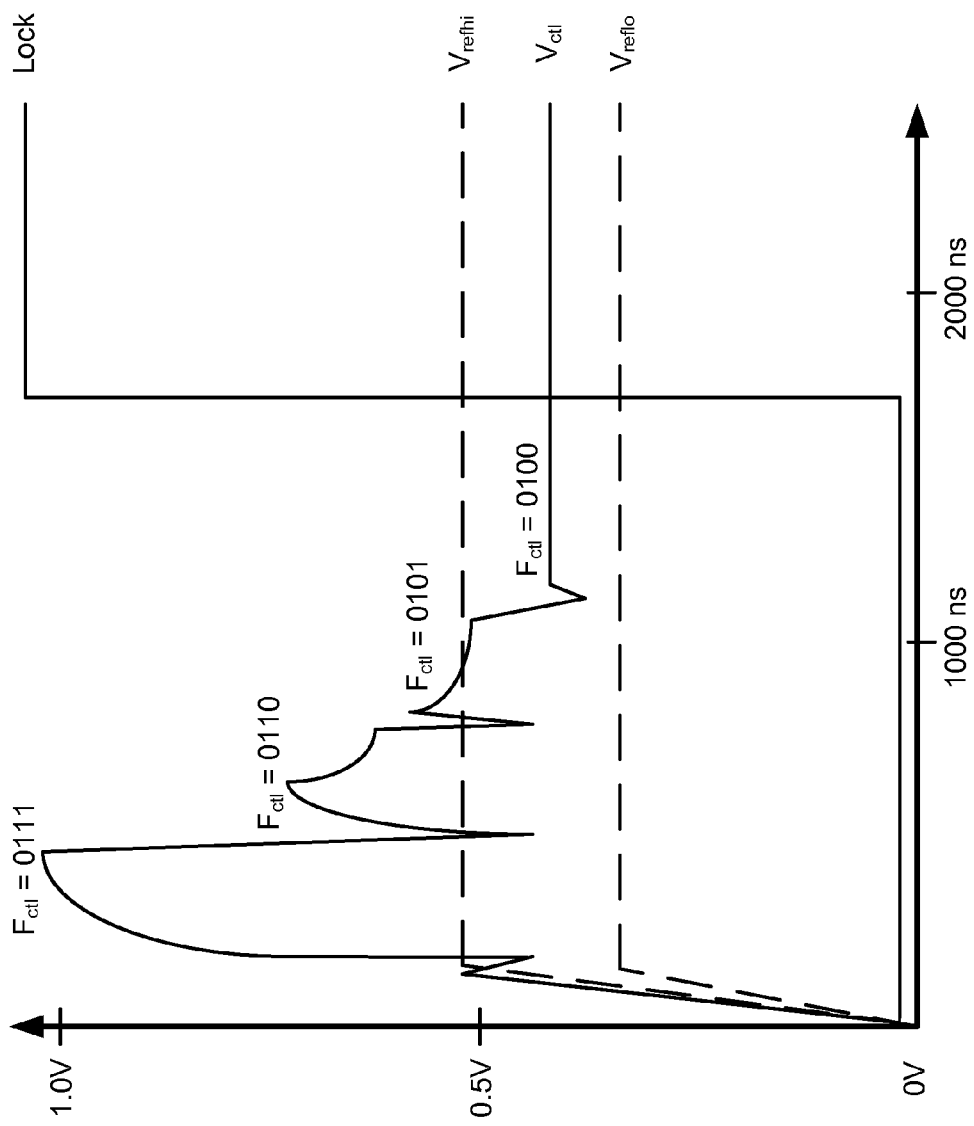
FIG. 9 illustrates an LC-PLL locking process using automatic frequency control in accordance with an embodiment of the present invention.

FIG. 9 illustrates an LC-PLL locking process using automatic frequency control in accordance with an embodiment of the present invention. The $V_{ctl}$ in the example locking process in the full-loop simulation is shown. In this particular example case, the locking process starts at $F_{ctl}$=0111, and loop finds the lock condition at $F_{ctl}$=0100, with $V_{ctl}$=0.4V. The waiting time of each $F_{ctl}$ code stepping is about 320 ns in this example case.

Numerous embodiments and configurations will be apparent in light of this disclosure. For instance, one example embodiment of the present invention provides a voltage-controlled oscillator device (e.g., integrated circuit or printed circuit module, etc). The device includes a tank circuit having a capacitor and an inductor and for providing an oscillating frequency in response to a control voltage. The device further includes a control block responsive to a frequency control signal and for adjusting oscillation frequency. The device further includes a post-lock temperature compensation block responsive to a temperature compensation control signal and for adjusting post-lock oscillation frequency. In some specific configurations, the device may include a cross-coupled pair of NMOS transistors, a cross-coupled pair of PMOS transistors, and a current source responsive to an amplitude control signal and for adjusting oscillation amplitude. In another specific configuration, the capacitor can be configured as a varactor responsive to the control voltage. In another specific configuration, the frequency control signal may be binary coded to allow for multiple frequency control signal values, and the control block provides one of a plurality of capacitor loadings depending on the frequency control signal value applied. In another specific configuration, the control block may include a plurality of control circuits, each responsive to a corresponding bit of the frequency control signal and including a capacitance that can be switched-in to supplement capacitance of the tank circuit when that corresponding bit is active. In another specific configuration, the temperature compensation control signal may be thermometer coded to allow for multiple temperature compensation control signal values, and the post-lock temperature compensation block provides one of a plurality of capacitor loadings depending on the temperature compensation control signal value applied. In another specific configuration, the post-lock temperature compensation block may include a plurality of capacitive legs, each selectable by a corresponding bit of the temperature compensation control signal to supplement capacitance of the tank circuit when that corresponding bit is active. In another specific configuration, the control block may include a plurality of control circuits, each responsive to a corresponding bit of the frequency control signal and including a capacitance that can be switched-in to supplement capacitance of the tank circuit when that corresponding bit is active, and the post-lock temperature compensation block may include a plurality of capacitive legs, each selectable by a corresponding bit of the temperature compensation control signal to supplement capacitance of the tank circuit when that corresponding bit is active. In one such case, capacitance range provided by the control block is larger in terms of capacitance and does not overlap with capacitance range provided by the post-lock temperature compensation block. In another specific configuration, the device may include phase lock loop functionality and further includes a phase-frequency detector, a lock detector, a charge pump/loop filter, an automatic amplitude control circuit, one or more frequency divider circuits, and/or an output buffer and/or level shifter. In another specific configuration, the device may include phase lock loop functionality and further includes an automatic frequency control circuit for generating the frequency control signal. In one such case, the automatic frequency control circuit may be further configured for generating the temperature compensation control signal. In another such case, the automatic frequency control circuit may include a reset circuit for resetting the control voltage to an initial value in response to the control voltage being outside a linear region of the device for a first specified time period, an AFC freeze control circuit for causing the automatic frequency control circuit to enter a freeze mode in response to lock being acquired and the control voltage being within the linear region of the device for a second specified time period, and a PFD control circuit for enabling a phase-frequency detector. Here, the automatic frequency control circuit may further include a comparator circuit for detecting when the control voltage is outside the linear region of the device, a detect/ timer circuit for indicating the control voltage is outside the linear region of the device for the first specified time period, an up/down counter for adjusting the frequency control signal in response to the control voltage being outside the linear region of the device for the first specified time period. In another case, the temperature compensation block is activated after lock is acquired and the automatic frequency control circuit enters the freeze mode.

Another example embodiment of the present invention provides a system (e.g., integrated circuit or printed circuit module or computer system, etc). The system includes a voltage controlled oscillator, including a tank circuit having a capacitor and an inductor and for providing an oscillating frequency in response to a control voltage, a control block responsive to a frequency control signal and for adjusting oscillation frequency, and a post-lock temperature compensation block responsive to a temperature compensation control signal and for adjusting post-lock oscillation frequency. The system further includes a phase-frequency detector, a lock detector, a charge pump/loop filter, an automatic amplitude control circuit, and an automatic frequency control circuit for generating the frequency control signal. The system may further include a current source responsive to an amplitude control signal generated by the automatic amplitude control circuit and for adjusting oscillation amplitude, one or more frequency divider circuits, and/or an output buffer and/ or level shifter. In one specific configuration, the frequency control signal can be binary coded to allow for multiple frequency control signal values, and the control block provides one of a plurality of capacitor loadings depending on the frequency control signal value applied. In another specific configuration, the temperature compensation control signal can be thermometer coded to allow for multiple temperature compensation control signal values, and the post-lock temperature compensation block provides one of a plurality of capacitor loadings depending on the temperature compensation control signal value applied. In another specific configuration, the control block may include a plurality of control circuits, each responsive to a corresponding bit of the frequency control signal and including a capacitance that can be switched-in to supplement capacitance of the tank circuit when that corresponding bit is active, and the post-lock temperature compensation block may include a plurality of capacitive legs, each selectable by a corresponding bit of the temperature compensation control signal to supplement capacitance of the tank circuit when that corresponding bit is active. In one such case, capacitance range provided by the control block is larger in terms of capacitance and does not overlap with capacitance range provided by the post-lock temperature compensation block. In another specific configuration, the automatic frequency control circuit may be further configured for generating the temperature compensation control signal. In another specific configuration, the automatic frequency control circuit may include a reset circuit for resetting the control voltage to an initial value in response to the control voltage being outside a linear region of the voltage controlled oscillator for a first specified time period, an AFC freeze control circuit for causing the automatic frequency control circuit to enter a freeze mode in response to lock being acquired and the control voltage being within the linear region of the voltage controlled oscillator for a second specified time period, and a PFD control circuit for enabling a phase-frequency detector. In one specific such case the automatic frequency control circuit may further include a comparator circuit for detecting when the control voltage is outside the linear region of the voltage controlled oscillator, a detect/timer circuit for indicating the control voltage is outside the linear region of the voltage controlled oscillator for the first specified time period, and an up/down counter for adjusting the frequency control signal in response to the control voltage being outside the linear region of the voltage controlled oscillator for the first specified time period. In another specific configuration, the temperature compensation block may be activated after lock is acquired and the automatic frequency control circuit enters a freeze mode. In another specific configuration, the system can be implemented in an integrated circuit chip or chip set.

Another example embodiment of the present invention provides a system including a voltage controlled oscillator. The voltage controlled oscillator includes a tank circuit having a capacitor and an inductor and for providing an oscillating frequency in response to a control voltage, a control block responsive to a frequency control signal and for adjusting oscillation frequency, and a post-lock temperature compensation block responsive to a temperature compensation control signal and for adjusting post-lock oscillation frequency. The frequency control signal is binary coded and the control block includes a plurality of control circuits, each responsive to a corresponding bit of the frequency control signal and including a capacitance that can be switched-in to supplement capacitance of the tank circuit when that corresponding bit is active. The temperature compensation control signal is thermometer coded and the post-lock temperature compensation block includes a plurality of capacitive legs, each selectable by a corresponding bit of the temperature compensation control signal to supplement capacitance of the tank circuit when that corresponding bit is active. The capacitance range provided by the control block is larger in terms of capacitance and does not overlap with capacitance range provided by the post-lock temperature compensation block. The system further includes a phase-frequency detector, a lock detector, a charge pump/loop filter, an automatic amplitude control circuit, an automatic frequency control circuit for generating the frequency control signal, the automatic frequency control circuit. The automatic frequency control circuit includes a reset circuit for resetting the control voltage to an initial value in response to the control voltage being outside a linear region of the voltage controlled oscillator for a first specified time period, an AFC freeze control circuit for causing the automatic frequency control circuit to enter a freeze mode in response to lock being acquired and the control voltage being within the linear region of the voltage controlled oscillator for a second specified time period, and a PFD control circuit for enabling a phase-frequency detector. The temperature compensation block is activated after lock is acquired and the automatic frequency control circuit enters the freeze mode. In one specific configuration, the automatic frequency control circuit is further configured for generating the temperature compensation control signal.

The foregoing description of example embodiments of the invention has been presented for the purposes of illustration and description. It is not intended to be exhaustive or to limit the invention to the precise forms disclosed. Many modifications and variations are possible in light of this disclosure. It is intended that the scope of the invention be limited not by this detailed description, but rather by the claims appended hereto.

What is claimed is:

1. A phase lock loop (PLL) voltage-controlled oscillator device, comprising:
    a tank circuit having a capacitor and an inductor and for providing an oscillating frequency in response to a control voltage;
    a control block responsive to a frequency control signal and for adjusting oscillation frequency, wherein the device is associated with a frequency verse control voltage curve having a first region for determining if a PLL lock condition is satisfied and defined by $V_{reflo}$ and $V_{refhi}$, where $V_{reflo}$ is a lower limit of the first region and $V_{refhi}$ is an upper limit of the first region;
    a post-lock temperature compensation block configured with a switchable multi-leg capacitor bank that is responsive to a digital temperature compensation control signal and for adjusting post-lock oscillation frequency; and
    an automatic frequency control circuit for generating the frequency control signal and configured with:
        a reset circuit for resetting the control voltage to a mid-range value between $V_{reflo}$ and $V_{refhi}$ in response to the PLL lock condition not being satisfied and the control voltage being either greater than $V_{refhi}$ for a specified waiting time period or less than $V_{reflo}$ for a specified waiting time period; and
        an AFC freeze control circuit for causing the automatic frequency control circuit to enter a freeze mode in response to lock being acquired and the control voltage being between $V_{reflo}$ and $V_{refhi}$ for a specified waiting time period;
    wherein the frequency verse control voltage curve has a second region defined by $V_{bot}$ and $V_{top}$, where $V_{bot}$ is less than $V_{reflo}$ and $V_{top}$ is greater than $V_{refhi}$, such that the first region is within the second region;
    wherein in response to lock being acquired and the control voltage being greater than $V_{top}$, capacitor legs of the multi-leg capacitor bank are sequentially disengaged until the control voltage is at an acceptable level; and
    wherein in response to lock being acquired and the control voltage being less than $V_{bot}$, capacitor legs of the multi-leg capacitor bank are sequentially engaged until the control voltage is at an acceptable level.

2. The device of claim 1 further comprising:
    a cross-coupled pair of NMOS transistors;
    a cross-coupled pair of PMOS transistors; and
    a current source responsive to an amplitude control signal and for adjusting oscillation amplitude.

3. The device of claim 1 wherein the capacitor is configured as a varactor responsive to the control voltage.

4. The device of claim 1 wherein the frequency control signal is binary coded to allow for multiple frequency control signal values, and the control block provides one of a plurality of capacitor loadings depending on the frequency control signal value applied.

5. The device of claim 1 wherein the control block includes a plurality of control circuits, each responsive to a corresponding bit of the frequency control signal and including a capacitance that can be switched-in to supplement capacitance of the tank circuit when that corresponding bit is active.

6. The device of claim 1 wherein the temperature compensation control signal is thermometer coded to allow for multiple temperature compensation control signal values, and the post-lock temperature compensation block provides one of a plurality of capacitor loadings depending on the temperature compensation control signal value applied.

7. The device of claim 1 wherein each leg of the multi-leg capacitor bank is selectable by a corresponding bit of the temperature compensation control signal to supplement capacitance of the tank circuit when that corresponding bit is active.

8. The device of claim 1 wherein:
the control block includes a plurality of control circuits, each responsive to a corresponding bit of the frequency control signal and including a capacitance that can be switched-in to supplement capacitance of the tank circuit when that corresponding bit is active; and
each leg of the multi-leg capacitor bank is selectable by a corresponding bit of the temperature compensation control signal to supplement capacitance of the tank circuit when that corresponding bit is active;
wherein capacitance range provided by the control block is larger in terms of capacitance and does not overlap with capacitance range provided by the post-lock temperature compensation block.

9. The device of claim 1 wherein the device includes phase lock loop functionality and further comprises at least one of:
a phase-frequency detector;
a lock detector;
a charge pump/loop filter;
an automatic amplitude control circuit;
one or more frequency divider circuits; and
an output buffer and/or level shifter.

10. The device of claim 1 wherein:
in response to the PLL lock condition not being satisfied and the control voltage being greater than $V_{refhi}$ for a specified waiting time period, the automatic frequency control circuit is configured to decrease the frequency control signal value by one bit thereby changing to a next frequency verse control voltage curve associated with the new lower frequency control signal value to initiate a locking process; and
in response to the PLL lock condition not being satisfied and the control voltage being less than $V_{reflo}$ for a specified waiting time period, the automatic frequency control circuit is configured to increase the frequency control signal value by one bit thereby changing to a next frequency verse control voltage curve associated with the new higher frequency control signal value to initiate a locking process; and
wherein once a locking process is initiated, the control voltage is initialized to a reference voltage value between $V_{reflo}$ and $V_{refhi}$.

11. The device of claim 10 wherein the automatic frequency control circuit is further configured for generating the temperature compensation control signal.

12. The device of claim 10 wherein the automatic frequency control circuit further comprises:
a PFD control circuit for enabling a phase-frequency detector.

13. The device of claim 12 wherein the automatic frequency control circuit further comprises:
a comparator circuit for detecting when the control voltage is either greater than $V_{reflo}$ or less than $V_{reflo}$;
a detect/timer circuit for indicating the control voltage is either greater than $V_{refhi}$ for a specified waiting time period or less than $V_{reflo}$ for a specified waiting time period; and
an up/down counter for adjusting the frequency control signal in response to the control voltage being either greater than $V_{refhi}$ for a specified waiting time period or less than $V_{reflo}$ for a specified waiting time period.

14. The device of claim 12 wherein the multi-leg capacitor bank is activated to provide post-lock compensation only after lock is acquired and the automatic frequency control circuit enters the freeze mode, such that the control voltage stays locked on a selected one of a plurality of frequency verse control voltage curves as capacitor legs of the multi-leg capacitor bank are sequentially engaged and disengaged.

15. A phase lock loop (PLL) system, comprising:
a voltage controlled oscillator, including:
a tank circuit having a capacitor and an inductor and for providing an oscillating frequency in response to a control voltage;
a control block responsive to a frequency control signal and for adjusting oscillation frequency, wherein the voltage controlled oscillator is associated with a frequency verse control voltage curve having a first region for determining if a PLL lock condition is satisfied and defined by $V_{reflo}$ and $V_{refhi}$, where $V_{reflo}$ is a lower voltage limit of the first region and $V_{refhi}$ is an upper voltage limit of the first region; and
a post-lock temperature compensation block configured with a switchable multi-leg capacitor bank that is responsive to a digital temperature compensation control signal and for adjusting post-lock oscillation frequency;
wherein the frequency verse control voltage curve has a second region defined by $V_{bot}$ and $V_{top}$, where $V_{bot}$ is less than $V_{reflo}$ and $V_{top}$ is greater than $V_{refhi}$, such that the first region is within the second region;
wherein in response to lock being acquired and the control voltage being greater than $V_{top}$, capacitor legs of the multi-leg capacitor bank are sequentially disengaged until the control voltage is at an acceptable level; and
wherein in response to lock being acquired and the control voltage being less than $V_{bot}$, capacitor legs of the multi-leg capacitor bank are sequentially engaged until the control voltage is at an acceptable level;
a phase-frequency detector;
a lock detector;
a charge pump/loop filter;
an automatic amplitude control circuit; and
an automatic frequency control circuit for generating the frequency control signal, and configured with:
a reset circuit for resetting the control voltage to a mid-range value between $V_{reflo}$ and $V_{refhi}$ in response to the PLL lock condition not being satisfied and the control voltage being either greater than $V_{refhi}$ for a specified waiting time period or less than $V_{reflo}$ for a specified waiting time period; and
an AFC freeze control circuit for causing the automatic frequency control circuit to enter a freeze mode in response to lock being acquired and the control voltage being between $V_{reflo}$ and $V_{refhi}$ for a specified waiting time period.

16. The system of claim 15 further comprising at least one of:
a current source responsive to an amplitude control signal generated by the automatic amplitude control circuit and for adjusting oscillation amplitude;
one or more frequency divider circuits; and
an output buffer and/or level shifter.

17. The system of claim 15 wherein the frequency control signal is binary coded to allow for multiple frequency control signal values, and the control block provides one of a plurality of capacitor loadings depending on the frequency control signal value applied.

18. The system of claim 15 wherein the temperature compensation control signal is thermometer coded to allow for multiple temperature compensation control signal values, and the post-lock temperature compensation block provides one of a plurality of capacitor loadings depending on the temperature compensation control signal value applied.

19. The system of claim 15 wherein:
the control block includes a plurality of control circuits, each responsive to a corresponding bit of the frequency control signal and including a capacitance that can be switched-in to supplement capacitance of the tank circuit when that corresponding bit is active; and
each leg of the multi-leg capacitor bank is selectable by a corresponding bit of the temperature compensation control signal to supplement capacitance of the tank circuit when that corresponding bit is active;
wherein capacitance range provided by the control block is larger in terms of capacitance and does not overlap with capacitance range provided by the post-lock temperature compensation block.

20. The system of claim 15 wherein:
in response to the PLL lock condition not being satisfied and the control voltage being greater than $V_{refhi}$ for a specified waiting time period, the automatic frequency control circuit is configured to decrease the frequency control signal value by one bit thereby changing to a next frequency verse control voltage curve associated with the new lower frequency control signal value to initiate a locking process; and
in response to the PLL lock condition not being satisfied and the control voltage being less than $V_{reflo}$ for a specified waiting time period, the automatic frequency control circuit is configured to increase the frequency control signal value by one bit thereby changing to a next frequency verse control voltage curve associated with the new higher frequency control signal value to initiate a locking process; and
wherein once a locking process is initiated, the control voltage is initialized to a reference voltage value between $V_{reflo}$ and $V_{refhi}$.

21. The system of claim 15 wherein the automatic frequency control circuit further comprises:
a PFD control circuit for enabling the phase-frequency detector.

22. The system of claim 21 wherein the automatic frequency control circuit further comprises:
a comparator circuit for detecting when the control voltage is either greater than $V_{refhi}$ or less than $V_{reflo}$;
a detect/timer circuit for indicating the control voltage is either greater than $V_{refhi}$ for a specified waiting time period or less than $V_{reflo}$ for a specified waiting time period; and
an up/down counter for adjusting the frequency control signal in response to the control voltage being either greater than $V_{refhi}$ for a specified waiting time period or less than $V_{reflo}$ for a specified waiting time period.

23. The system of claim 15 wherein the multi-leg capacitor bank is activated to provide post-lock compensation only after lock is acquired and the automatic frequency control circuit enters a freeze mode, such that the control voltage stays locked on a selected one of a plurality of frequency verse control voltage curves as capacitor legs of the multi-leg capacitor bank are sequentially engaged and disengaged.

24. The system of claim 15 wherein the system is implemented in an integrated circuit chip or chip set.

25. A phase lock loop (PLL) system, comprising:
a voltage controlled oscillator, including:
a tank circuit having a capacitor and an inductor and for providing an oscillating frequency in response to a control voltage;
a control block responsive to a frequency control signal and for adjusting oscillation frequency, wherein the voltage controlled oscillator is associated with a plurality of frequency verse control voltage curves each having a first region for determining if a PLL lock condition is satisfied and defined by $V_{reflo}$ and $V_{refhi}$, where $V_{reflo}$ is a lower voltage limit of the first region and $V_{refhi}$ is an upper voltage limit of the first region, and wherein the frequency control signal is binary coded and the control block includes a plurality of control circuits, each responsive to a corresponding bit of the frequency control signal and including a capacitance that can be switched-in to supplement capacitance of the tank circuit when that corresponding bit is active; and
a post-lock temperature compensation block configured with a switchable multi-leg capacitor bank that is responsive to a digital temperature compensation control signal and for adjusting post-lock oscillation frequency, wherein the temperature compensation control signal is thermometer coded and each leg of the multi-leg capacitor bank is selectable by a corresponding bit of the temperature compensation control signal to supplement capacitance of the tank circuit when that corresponding bit is active;
wherein capacitance range provided by the control block is larger in terms of capacitance and does not overlap with capacitance range provided by the post-lock temperature compensation block;
wherein each of the frequency verse control voltage curves has a second region defined by $V_{bot}$ and $V_{top}$, where $V_{bot}$ is less than $V_{reflo}$ and $V_{top}$ is greater than $V_{refhi}$, such that the first region is within the second region;
wherein in response to lock being acquired and the control voltage being greater than $V_{top}$, capacitor legs of the multi-leg capacitor bank are sequentially disengaged until the control voltage is at an acceptable level;
wherein in response to lock being acquired and the control voltage being less than $V_{bot}$, capacitor legs of the multi-leg capacitor bank are sequentially engaged until the control voltage is at an acceptable level;
a phase-frequency detector;
a lock detector;
a charge pump/loop filter;
an automatic amplitude control circuit; and
an automatic frequency control circuit for generating the frequency control signal, the automatic frequency control circuit including:
a reset circuit for resetting the control voltage to a mid-range value between $V_{reflo}$ and $V_{refhi}$ in response to the PLL lock condition not being satisfied and the control voltage being either greater than $V_{refhi}$ for a specified waiting time period or less than $V_{reflo}$ for a specified waiting time period;
an AFC freeze control circuit for causing the automatic frequency control circuit to enter a freeze mode in response to lock being acquired and the control voltage being between $V_{reflo}$ and $V_{refhi}$ for a specified waiting time period; and a PFD control circuit for enabling the phase-frequency detector;

wherein the multi-leg capacitor bank is activated to provide post-lock compensation only after lock is acquired and the automatic frequency control circuit enters the freeze mode, such that the control voltage stays locked on a selected one of the frequency verse control voltage curves as capacitor legs of the multi-leg capacitor bank are sequentially engaged and disengaged.

26. The system of claim 25 wherein:

in response to the PLL lock condition not being satisfied and the control voltage being greater than $V_{refhi}$ for a specified waiting time period, the automatic frequency control circuit is configured to decrease the frequency control signal value by one bit thereby changing to a next frequency verse control voltage curve associated with the new lower frequency control signal value to initiate a locking process; and in response to the PLL lock condition not being satisfied and the control voltage being less than $V_{reflo}$ for a specified waiting time period, the automatic frequency control circuit is configured to increase the frequency control signal value by one bit thereby changing to a next frequency verse control voltage curve associated with the new higher frequency control signal value to initiate a locking process.

* * * * *

UNITED STATES PATENT AND TRADEMARK OFFICE
CERTIFICATE OF CORRECTION

PATENT NO. : 8,274,339 B2
APPLICATION NO. : 12/770230
DATED : September 25, 2012
INVENTOR(S) : Yongping Fan et al.

It is certified that error appears in the above-identified patent and that said Letters Patent is hereby corrected as shown below:

In column 19, line 54, in claim 13, delete first occurrence of "$V_{reflo}$" and insert -- $V_{refhi}$ --, therefor.

Signed and Sealed this
Eighteenth Day of December, 2012

David J. Kappos
*Director of the United States Patent and Trademark Office*